(12) United States Patent
Isakanian et al.

(10) Patent No.: US 12,021,669 B2
(45) Date of Patent: Jun. 25, 2024

(54) CLOCKED COMPARATOR WITH SERIES DECISION FEEDBACK EQUALIZATION

(71) Applicant: QUALCOMM Incorporated, San Diego, CA (US)

(72) Inventors: Patrick Isakanian, El Dorado Hills, CA (US); Darius Valaee, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/985,498

(22) Filed: Nov. 11, 2022

(65) Prior Publication Data
US 2024/0163137 A1    May 16, 2024

(51) Int. Cl.
*H04L 25/03*    (2006.01)

(52) U.S. Cl.
CPC .............. *H04L 25/03057* (2013.01)

(58) Field of Classification Search
CPC ......... H04L 25/03006; H04L 25/03019; H04L 25/03057; H04L 25/03254; H04L 25/03267; H04L 25/0349; H04L 25/03885; H04L 2025/0349
USPC ........ 375/232, 233, 346, 348, 350; 708/322, 708/323
See application file for complete search history.

(56) References Cited

U.S. PATENT DOCUMENTS

| | | |
|---|---|---|
| 9,699,009 B1 | 7/2017 | Ainspan et al. |
| 10,348,534 B1 | 7/2019 | Sreeramaneni et al. |
| 10,523,472 B1 | 12/2019 | Zhao et al. |
| 11,164,623 B1 | 11/2021 | Nakamura et al. |
| 11,183,982 B2 | 11/2021 | Tajalli |
| 2008/0089155 A1 | 4/2008 | Bae |
| 2010/0020862 A1* | 1/2010 | Peng ............... H04B 1/036 375/233 |
| 2012/0274359 A1 | 11/2012 | Ding et al. |
| 2017/0085403 A1* | 3/2017 | Sun ............... H04L 25/03146 |

(Continued)

FOREIGN PATENT DOCUMENTS

CN    113556104 A    10/2021

OTHER PUBLICATIONS

Kim Y-J., et al., "A 16-Gb, 18-Gb/s/pin GDDR6 DRAM With Per-Bit Trainable Single-Ended DFE and PLL-Less Clocking", IEEE Journal Of Solid-State Circuits, vol. 54, No. 1, Jan. 2019, pp. 197-209.

(Continued)

*Primary Examiner* — Young T. Tse
(74) *Attorney, Agent, or Firm* — Loza & Loza, LLP

(57) ABSTRACT

An input stage of a comparator includes a first transistor, wherein a gate of the first transistor is coupled to a first input of the input stage, a second transistor, wherein a gate of the second transistor is coupled to a second input of the input stage, a third transistor coupled in series with the first transistor, and a fourth transistor coupled in series with the second transistor. The input stage also includes a fifth transistor, wherein a gate of the fifth transistor is configured to receive a first decision feedback signal, and a drain of the fifth transistor is coupled to a gate of the third transistor. The input stage further includes a sixth transistor, wherein a gate of the sixth transistor is configured to receive a second decision feedback signal, and a drain of the sixth transistor is coupled to a gate of the fourth transistor.

26 Claims, 15 Drawing Sheets

(56) References Cited

U.S. PATENT DOCUMENTS

| | | | |
|---|---|---|---|
| 2018/0343149 A1 | 11/2018 | Kim et al. | |
| 2019/0312757 A1 | 10/2019 | Sakai | |
| 2020/0067499 A1 | 2/2020 | Takase | |
| 2020/0116765 A1 | 4/2020 | Ahn | |
| 2021/0184640 A1 | 6/2021 | Miura | |
| 2021/0288846 A1* | 9/2021 | Yi | H03F 3/193 |
| 2022/0077830 A1* | 3/2022 | Duan | H04L 25/03878 |
| 2023/0023730 A1* | 1/2023 | Lin | G11C 7/222 |
| 2023/0074266 A1 | 3/2023 | Gu | |
| 2023/0188388 A1 | 6/2023 | Valaee et al. | |

OTHER PUBLICATIONS

Park M., et al., "A 7Gb/s 9.3mW 2-Tap Current-Integrating DFE Receiver", ISSCC 2007 / Session 12 / GIGABIT CDRs and Equalizers / 12.5, 2007 IEEE International Solid-State Circuits Conference, Feb. 13, 2007, 3 Pages.

Amaya A., et al., "A Digital Phase-Based on-fly Offset Compensation Method for Decision Feedback Equalisers", IET Circuits Devices and Systems, The Institution of Engineering and Technology, GB, vol. 15, No. 4, Mar. 21, 2021, pp. 297-309, XP006105687, 13 Pages, Figure 5.

Gu Y., et al., "A 2-stage with 3-Stack 1-Tap DFE Sense Amplifier Based on Dual Reference for High Speed & Low Power DRAM Interface", 2021 IEEE 14th International Conference on ASIC (ASICON), IEEE, Oct. 26, 2021, 4 Pages, XP034035556, Retrieved on Nov. 18, 2021, Section 3, Figures 4,5.

International Search Report and Written Opinion—PCT/US2023/073048—ISA/EPO—dated Dec. 22, 2023.

Milijevic S., et al., "4 Gbit/s Receiver with Adaptive Blind DFE", Electronics Letters, The Institution of Engineering and Technology, GB, vol. 41, No. 25, Dec. 8, 2005, XP006025663, pp. 1373-1374, 2 pages, figure 1.

\* cited by examiner

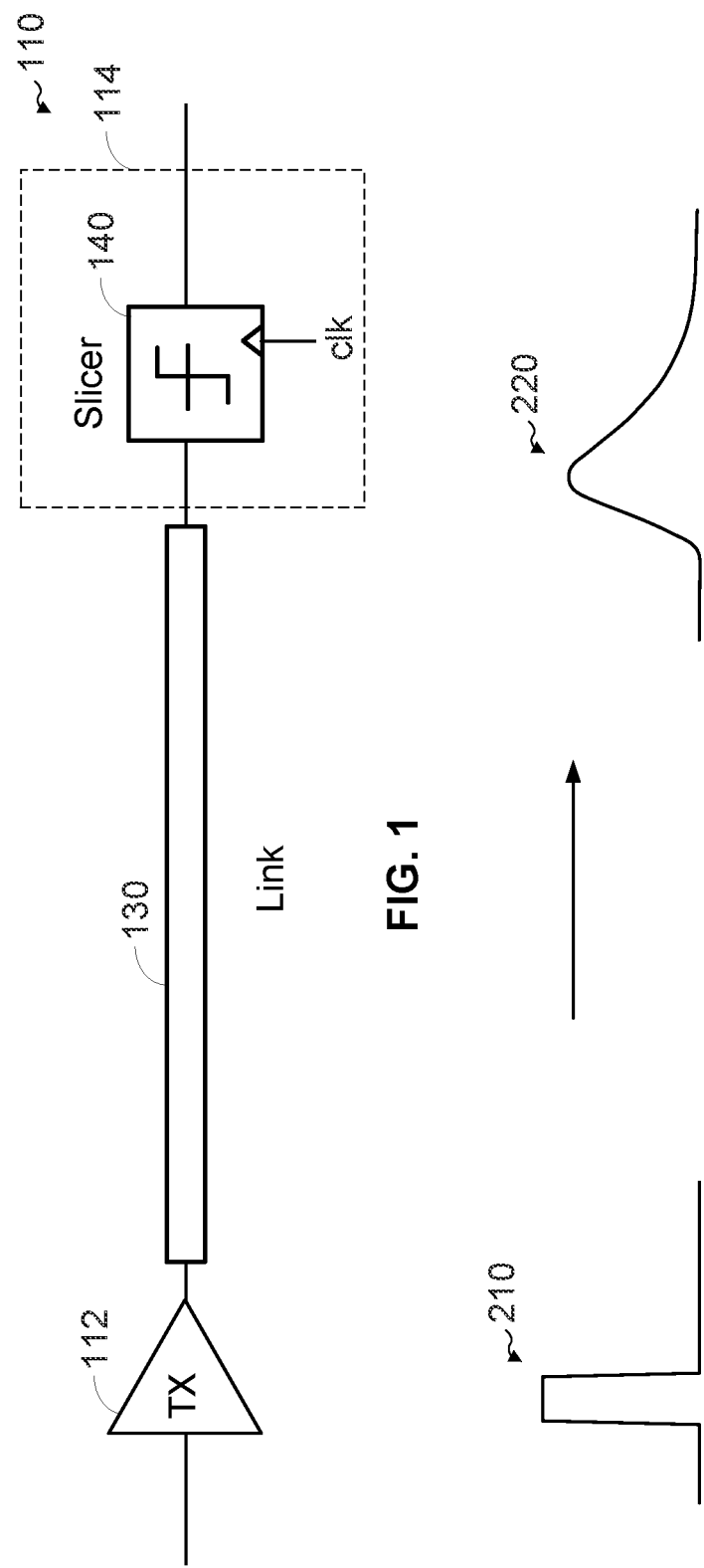

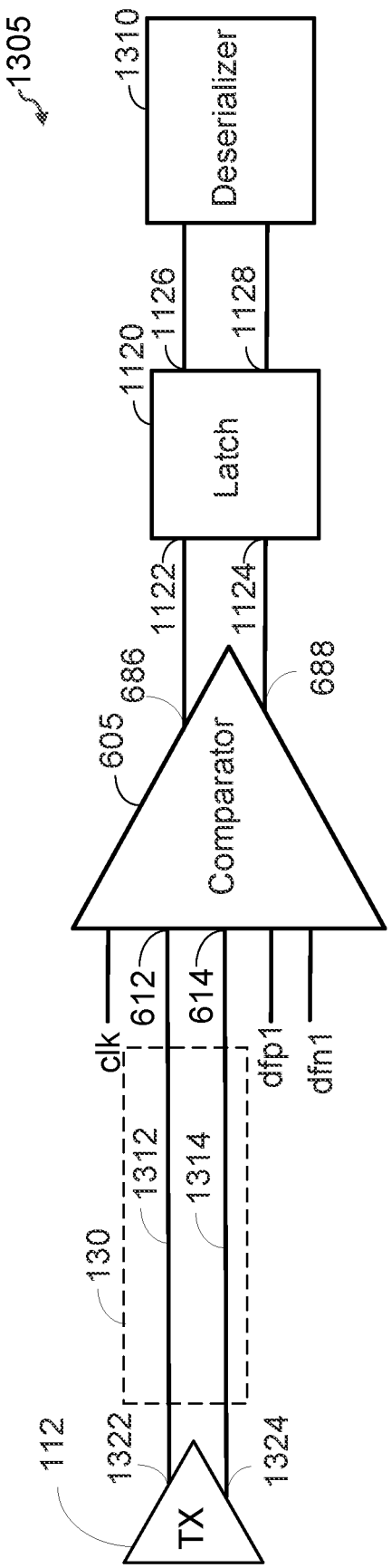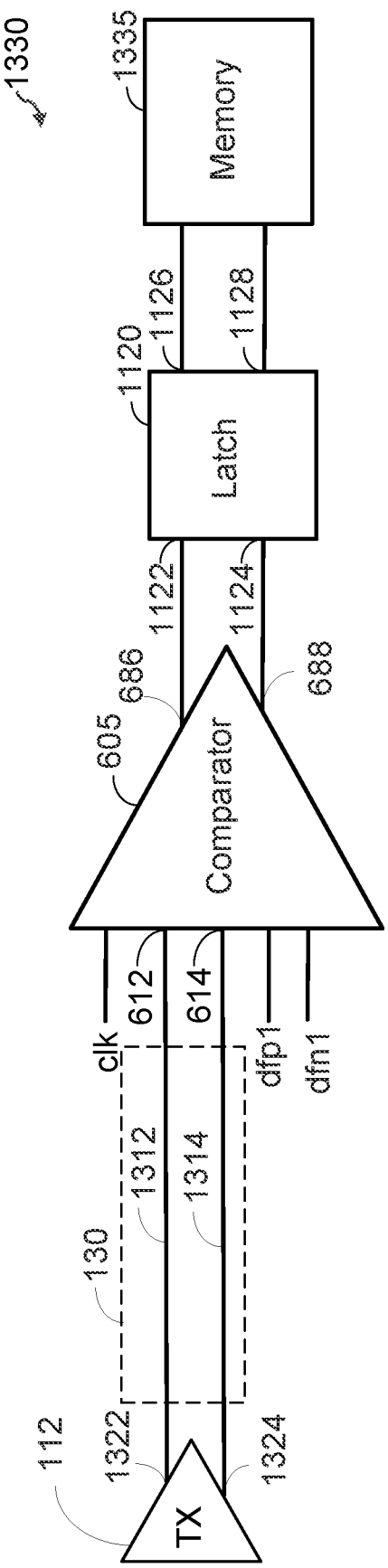

CLOCKED COMPARATOR WITH SERIES DECISION FEEDBACK EQUALIZATION

BACKGROUND

Field

Aspects of the present disclosure relate generally to equalizers, and more particularly, to decision feedback equalizers.

Background

In a system, data may be transmitted from a transmitter to a receiver across a link using symbols. Because of non-idealities in the link (e.g., notches in the frequency response of the link due to reflection), the incoming symbols at the receiver are distorted. The distortion may cause the symbols to spread into one another, resulting in intersymbol interference (ISI) at the receiver. The receiver may employ decision feedback equalization (DFE) to reduce the ISI.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a comparator. The comparator includes an input stage. The input stage includes a first transistor, wherein a gate of the first transistor is coupled to a first input of the input stage, and a second transistor, wherein a gate of the second transistor is coupled to a second input of the input stage. The input stage also includes a third transistor coupled in series with the first transistor, and a fourth transistor coupled in series with the second transistor. The input stage also includes a fifth transistor, wherein a gate of the fifth transistor is configured to receive a first decision feedback signal, and a drain of the fifth transistor is coupled to a gate of the third transistor. The input stage further includes a sixth transistor, wherein a gate of the sixth transistor is configured to receive a second decision feedback signal, and a drain of the sixth transistor is coupled to a gate of the fourth transistor.

A second aspect relates to a method of operating a comparator. The comparator including a first transistor, a second transistor, a third transistor, and a fourth transistor, wherein the third transistor is coupled series with the first transistor and coupled between the first transistor and a first node, and the fourth transistor is coupled in series with the second transistor and coupled between the second transistor and a second node. The method includes driving a gate of the first transistor with a first signal, driving a gate of the second transistor with a second signal, adjusting a first voltage at a gate of the third transistor based on a first decision feedback signal, adjusting a second voltage at a gate of the fourth transistor based on a second decision feedback signal, and making a bit decision based on a third voltage on the first node and a fourth voltage on the second node.

BRIEF DESCRIPTION OF THE DRAWINGS

FIG. 1 shows an example of a system according to certain aspects of the present disclosure.

FIG. 2 shows an example of signal distortion caused by non-idealities in a link according to certain aspects of the present disclosure.

FIG. 13A shows an example of a system including a comparator and a deserializer according to certain aspects of the present disclosure.

FIG. 13B shows an example of a system including a comparator and a memory according to certain aspects of the present disclosure.

DETAILED DESCRIPTION

Figure 3:
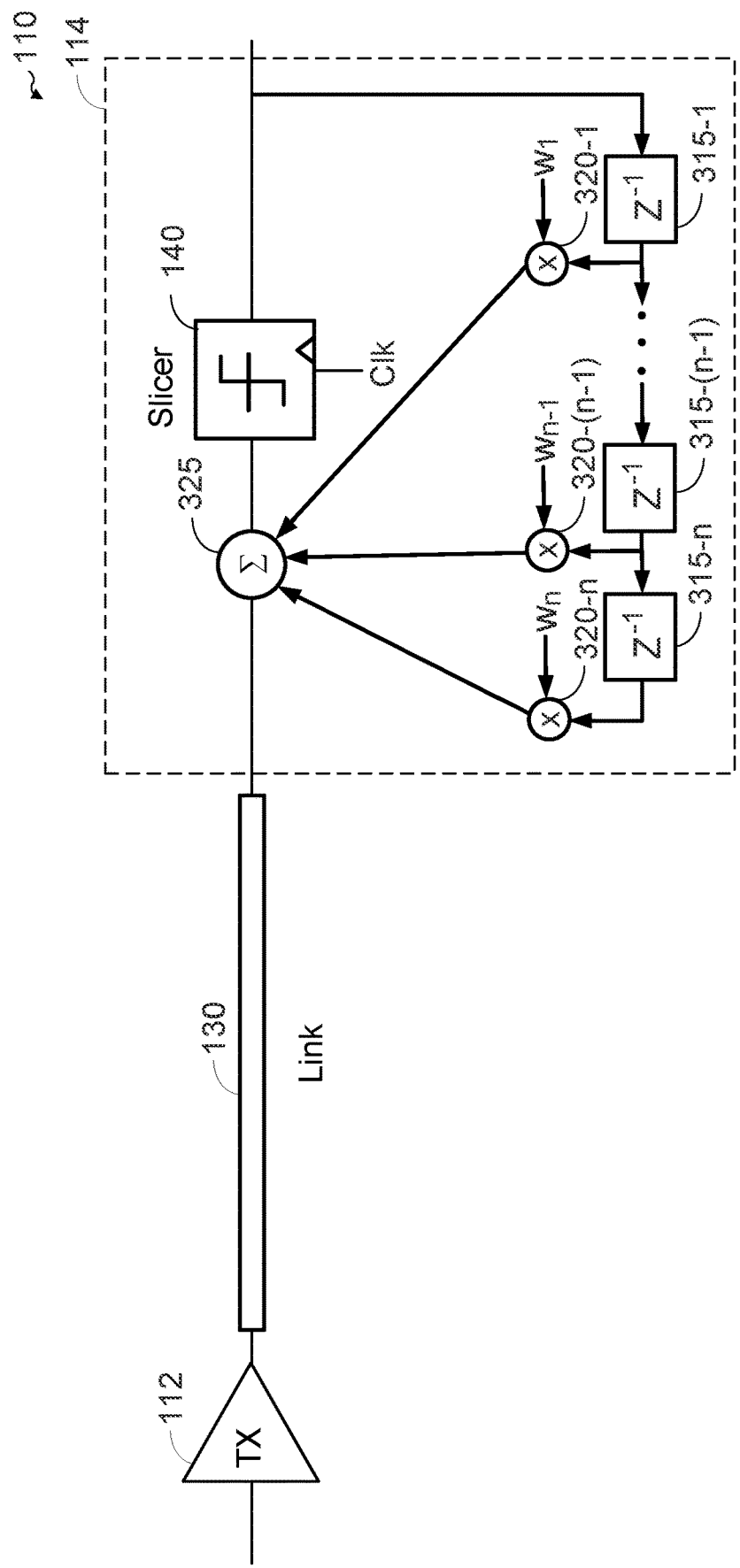
FIG. 3 shows a conceptual diagram of decision feedback equalization according to certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

FIG. 1 shows an example of a system 110 in which data is transmitted from a transmitter 112 to a receiver 114 across a link 130 (e.g., a serial link). The transmitter 112 receives bits from a data source (not shown) and transmits the bits as a sequence of symbols across the link 130. At the receiver 114, a slicer 140 (also referred to as a comparator) receives the symbols from the link 130 and converts the symbols into a sequence of bits (i.e., bit stream). The bit stream may be sent to a processor (not shown) or another circuit for further processing. It is to be appreciated that the receiver 114 may include one or more additional components not explicitly shown in FIG. 1. The system 110 may also include serializer/deserializer (SerDes), a double-data rate (DDR) dynamic random-access memory (DRAM), and/or another circuit, as discussed further below.

As discussed above, the transmitter 112 may transmit bits as symbols across the link 130. In certain aspects, each symbol carries one bit. Each symbol may be in the form of a pulse in which an amplitude (e.g., voltage) of the pulse represents the bit value (i.e., one or zero) of the respective bit. The slicer 140 receives a symbol and makes a bit decision based on the received symbol to obtain the respective bit. The bit decision may be made based on the voltage of the received symbol or another attribute of the received symbol.

FIG. 2 shows an example in which the transmitter 112 transmits a symbol 210 representing a bit value of one across the link 130. As shown in FIG. 2, the symbol 220 received at the receiver 114 is distorted due to non-idealities in the link 130 (e.g., limited bandwidth of the link 130, reflections, etc.). In this example, the distortion spreads out the symbol 220 received at the receiver 114. This may cause the symbol 220 to spread into the next symbol (not shown) at the receiver 114, resulting in intersymbol interference (ISI).

To reduce ISI, the receiver 114 may employ decision feedback equalization. In this regard, FIG. 3 is a conceptual diagram showing an example of decision feedback equalization implemented in the receiver 114 according to certain aspects.

In the example in FIG. 3, the receiver 114 includes delay elements 315-1 to 315-$n$ (e.g., latches), multipliers 320-1 to 320-$n$, and a summer 325. The summer 325 may be coupled between the link 130 and the input of the slicer 140. The delay elements 315-1 to 315-$n$ are coupled in series in which a first one of the delay elements 315-1 is coupled to the output of the slicer 140. Each of the multipliers 320-1 to 320-$n$ is coupled to the output of a respective one of the delay elements 315-1 to 315-$n$ and is configured to multiply the output of the respective one of the delay elements 315-1 to 315-$n$ by a respective weight $W_1$ to $W_n$. Each weight may be positive or negative. In the example in FIG. 3, the summer 325 is configured to sum the outputs of the multipliers 320-1 to 320-$n$ with the current symbol received at the receiver 114.

In operation, the delay elements 315-1 to 315-$n$ provide n previous bit decisions (e.g., n previous bit values) from the slicer 140. The multipliers 320-1 to 320-$n$ multiply the n previous bit decisions by the respective weights $W_1$ to $W_n$. The summer 325 sums the outputs of the multipliers 320-1 to 320-$n$ to obtain a weighted sum of the n previous bit decisions, and adds the weighted sum to the current symbol at the receiver 114. The weighted sum may be positive or negative.

Thus, a weighted sum of the n previous bit decisions is added to the current symbol to reduce ISI. The values of the weights $W_1$ to $W_n$ may be adjusted (i.e., programmed) according to the characteristics of the link 130 (e.g., frequency response of the link 130). FIG. 3 shows an example of n-tap decision feedback equalization in which a weighted sum of the n previous bit decisions is added to the current symbol. In this example, the decision feedback equalization implements a finite impulse response (FIR) filter in which the weights $W_1$ to $W_n$ correspond to the coefficients of the FIR filter.

It is to be appreciated that the exemplary decision feedback equalization conceptually illustrated in FIG. 3 may be implemented using any one of a variety of different circuits. It is also to be appreciated that decision feedback equalization may be implemented in various ways, and that two or more components shown in FIG. 3 may be combined into one component and/or incorporated into the slicer 140. In other words, it is to be appreciated that FIG. 3 is intended to illustrate the concept of decision feedback equalization using an example and is not intended to limit the present disclosure to any one implementation of a decision feedback equalizer.

It is to be appreciated that, in some implementations, symbols may be transmitted using a differential signal across a differential serial link. In these implementations, the differential signal includes a first signal and a second signal, in which the bit value of a symbol is represented by the polarity of the differential signal. For example, a symbol may represent a bit value of one when the first signal is greater than the second signal, and a symbol may represent a bit value of zero when the second signal is greater than the first signal. An example of DFE for a differential signal is discussed below.

Figure 4:
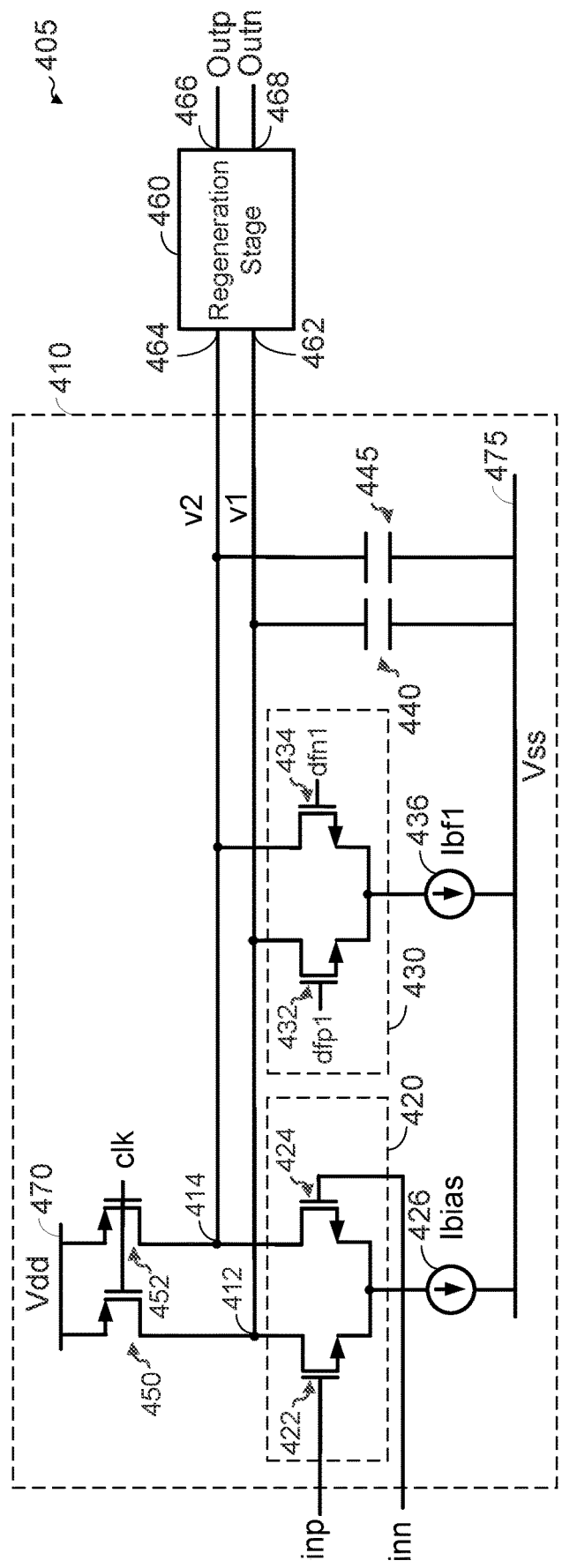
FIG. 4 shows an example of a comparator including parallel differential pairs for implementing decision feedback equalization (DFE) according to certain aspects of the present disclosure.

FIG. 4 shows an example of a comparator 405 that may be used to implement a slicer (e.g., the slicer 140) according to certain aspects. The comparator 405 may also be referred to as a sense amplifier, a slicer, or another term. The comparator 405 is configured to receive a differential input signal including a first signal inp and a second signal inn, and make bit decisions (i.e., resolve data bits) based on the differential input signal. In this example, the comparator 405 uses parallel differential pairs and current summing to implement decision feedback equalization (DFE), as discussed further below.

In this example, the comparator 405 includes an input stage 410 and a regeneration stage 460. The input stage 410 is configured to receive the differential input signal, and generate a first voltage v1 and a second voltage v2 based on the differential input signal. The regeneration stage 460 is configured to resolve data bits based on the first voltage v1 and the second voltage v2, as discussed further below.

The input stage 410 includes an input differential pair 420, a feedback differential pair 430, a first current source 426, a second current source 436, a first switch 450, a second switch 452, a first capacitor 440, and a second capacitor 445. The input differential pair 420 and the feedback differential pair 430 are coupled in parallel, in which the input differential pair 420 is driven by the differential input signal, and the feedback differential pair 430 provides DFE, as discussed further below.

In this example, the input differential pair 420 includes a first transistor 422 and a second transistor 424. The first signal inp (e.g., first input voltage) is input to the gate of the first transistor 422 and the second input signal inn (e.g., second input voltage) is input to the gate of the second transistor 424. In the example shown in FIG. 4, each of the first transistor 422 and the second transistor 424 is implemented with a respective n-type field effect transistor (NFET). However, it is to be appreciated that the present disclosure is not limited to this example.

The first switch 450 is coupled between a supply rail 470 and the drain of the first transistor 422, and the second switch 452 is coupled between the supply rail 470 and the drain of the second transistor 424. The supply rail 470 has a supply voltage Vdd (e.g., provided by a power distribution network). The switches 450 and 452 are clocked by a clock signal clk. In the example shown in FIG. 4, each of the switches 450 and 452 is implemented with a respective p-type field effect transistor (PFET) in which the gate of the respective PFET is driven by the clock signal clk. As discussed further below, the first voltage v1 output by the input stage 410 is provided at a first node 412 between the first switch 450 and the first transistor 422, and the second voltage v2 output by the input stage 410 is provided by a second node 414 between the second switch 452 and the second transistor 424.

The first current source 426 is coupled between the sources of the first and second transistors 422 and 424 and a low rail 475. The low rail 475 has a voltage Vss (i.e., potential) that is lower than the supply voltage Vdd of the supply rail 470. For example, the low rail 475 may be coupled to ground. The first current source 426 is configured to provide the first and second transistors 422 and 424 with a bias current Ibias.

The feedback differential pair 430 includes a third transistor 432 and a fourth transistor 434. A first decision feedback signal dfp1 may be input to the gate of the third transistor 432 and a second decision feedback signal dfn1 may be input to the gate of the fourth transistor 434. The first decision feedback signal dfp1 may correspond to the previous bit decision of the comparator 405 and the second decision feedback signal dfn1 may correspond to the complement (i.e., inverse) of the previous bit decision of the comparator 405, or vice versa. The first decision feedback signal dfp1 and the second decision feedback signal dfn1 may come from a latch (not shown) coupled to the comparator 405, in which the latch is configured to latch the previous bit decision of the comparator 405 and the complement of the previous bit decision of the comparator 405. The latch may be a set-reset (SR) latch or another type of latch. The drain of the third transistor 432 is coupled to the first node 412, and the drain of the fourth transistor 434 is coupled to the second node 414.

The second current source 436 is coupled between the sources of the third and fourth transistors 432 and 434 and the low rail 475 (e.g., ground). The second current source 436 is configured to provide the third and fourth transistors 432 and 434 with a bias current Ibf1. As discussed further below, the weight given to the previous bit decision in the DFE may be set by the bias current Ibf1.

In the example shown in FIG. 4, the first capacitor 440 is coupled between the first node 412 and the low rail 475, and the second capacitor 445 is coupled between the second node 414 and the low rail 475. The first capacitor 440 and the second capacitor 445 may have approximately the same capacitance.

The regeneration stage 460 has a first input 462, a second input 464, a first output 466, and a second output 468. The first input 462 is coupled to the first node 412 of the input stage 410, and the second input 464 is coupled to the second node 414 of the input stage 410. The regeneration stage 460 is configured to receive the first voltage v1 and the second voltage v2 via the first and second inputs 462 and 464, and make bit decisions based on the first voltage v1 and the second voltage v2, as discussed further below. The first output 466 and the second output 468 may be coupled to the latch discussed above (e.g., a set-reset (SR) latch or another type of latch).

Exemplary operations of the comparator 405 will now be discussed with reference to FIG. 5 according to certain aspects. For ease of discussion, exemplary operations of the comparator 405 without DFE are discussed first followed by a discussion of exemplary operations of the comparator 405 with DFE.

Figure 5:
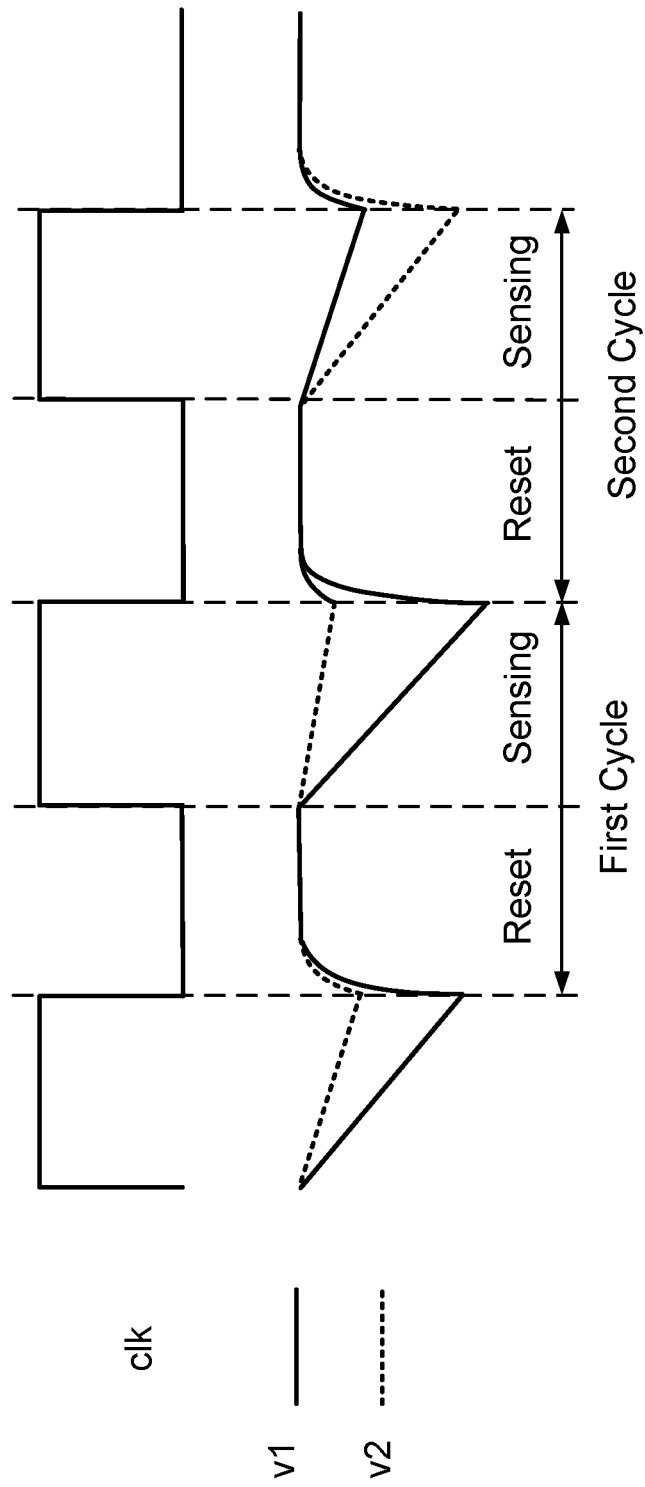
FIG. 5 is a timing diagram showing exemplary waveforms for the comparator in FIG. 4 according to certain aspects of the present disclosure.

FIG. 5 is a timing diagram showing an example of the clock signal clk used to clock the comparator 405, the first voltage v1, and the second voltage v2. In this example, the comparator 405 resolves a bit value during each cycle (i.e., period) of the clock signal clk. For each clock cycle, the comparator 405 may operate in a reset phase when the clock signal clk is low, and operate in a sensing phase when the clock signal clk is high. The sensing phase may also be referred to as an integration phase or another term. The clock signal may be a periodic signal that oscillates between high (i.e., logic one) and low (i.e., logic zero) at a clock frequency. The clock signal may come from a phase-locked loop or another type of clock circuit.

During the reset phase of each clock cycle, the first switch 450 and the second switch 452 are turned on. This causes the first capacitor 440 to charge up to the supply voltage Vdd through the first switch 450, and the first voltage v1 at the first node 412 to rise to approximately the supply voltage Vdd. This also causes the second capacitor 445 to charge up to the supply voltage Vdd through the second switch 452, and the second voltage v2 at the second node 414 to rise to approximately the supply voltage Vdd. Thus, the reset phase of each clock cycle resets the first voltage v1 and the second voltage v2 to approximately the supply voltage Vdd.

During the sensing phase of each clock cycle, the first switch 450 and the second switch 452 are turned off. The first transistor 422 provides a first current based on the first input signal inp that discharges the first capacitor 440, and the second transistor 424 provides a second current based on the second input signal inn that discharges the second capacitor 445. The first capacitor 440 and the second capacitor 445 discharge at different rates depending on the first current and the second current, which, in turn, depend on the first input signal inp and the second input signal inn. The different discharge rates cause the first voltage v1 and the second voltage v2 to decrease (i.e., ramp down) at different rates based on the first input signal inp and the second input signal inn during the sensing phase of each clock cycle, as shown in FIG. 5.

In the example shown in FIG. 5, the first input signal inp is greater than the second input signal inn during the sensing phase of a first cycle of the clock signal clk. In this case, the first current from the first transistor 422 is greater than the second current from the second transistor 424, which causes the first capacitor 440 to discharge faster than the second capacitor 445, and the first voltage v1 to decrease (i.e., ramp down) faster than the second voltage v2. As a result, the first voltage v1 and the second voltage v1 separate (i.e., diverge) in which the first voltage v1 is lower than the second voltage v2, as shown in FIG. 5. In this example, the regeneration stage 460 may be configured to resolve a bit value of one when the first voltage v1 ramps down at a faster rate than the second voltage v2, or vice versa. The regeneration stage 460 may output the resolved bit value at the first output 466 and output the complement (i.e., inverse) of the resolved bit value at the second output 468.

Also, in the example shown in FIG. 5, the second input inn is greater than the first input signal inp during the sensing phase of a second cycle of the clock signal clk. In this case, the second current from the second transistor 424 is greater than the first current from the first transistor 422, which causes the second capacitor 445 to discharge faster than the first capacitor 440, and the second voltage v2 to decrease (i.e., ramp down) faster than the first voltage v1. As a result, the first voltage v1 and the second voltage v2 separate (i.e., diverge) in which the first voltage v1 is greater than the second voltage v2, as shown in FIG. 5. In this example, the regeneration stage 460 may be configured to resolve a bit value of zero when the second voltage v2 ramps down at a faster rate than the first voltage v1, or vice versa. The regeneration stage 460 may output the resolved bit value at the first output 466 and output the complement (i.e., inverse) of the resolved bit value at the second output 468.

In the example shown in FIG. 4, the DFE is provided by the feedback differential pair 430, which is coupled in parallel with the input differential pair 420. In this example, the third transistor 432 provides a third current based on the first decision feedback signal dfp1. The third current is summed with the first current of the input differential pair 420 at the first node 412. As a result, the first capacitor 440 is discharged by the sum the first current and the third current. Thus, the third current adjusts the discharge rate of the first capacitor 440 (and hence the ramp down rate of the first voltage v1) based on the first decision feedback signal dfp1.

The fourth transistor 434 provides a fourth current based on the second decision feedback signal dfn1. The fourth current is summed with the second current of the input differential pair at the second node 414. As a result, the second capacitor 445 is discharged by the sum of the second current and the fourth current. Thus, the fourth current adjusts the discharge rate of the second capacitor 445 (and hence the ramp down rate of the second voltage v2) based on the second decision feedback signal dfn1.

Thus, the comparator 405 provides DFE using parallel differential pairs and current summing. The weight of the previous bit decision may be set by the bias current Ibf1 of the second current source 436. The higher the bias current Ibf1, the greater the weight.

FIG. 4 shows an example of 1-tap DFE which uses the most recent previous bit decision of the comparator 405 (i.e., the bit decision corresponding to the clock cycle immediately preceding the current clock cycle). The DFE in the comparator 405 may be expanded to include additional previous bit decisions (i.e., bit decisions corresponding to earlier clock cycles) by coupling additional feedback differential pairs in parallel with the input differential pair 420 where each one of the additional feedback differential pairs provides feedback for a respective one of the additional previous bit decisions.

A challenge with the DFE approach illustrated in FIG. 4 is that coupling differential pairs in parallel with the input differential pair 420 to provide the DFE may substantially increase the parasitic capacitances on the first node 412 and the second node 414. The increased parasitic capacitances may substantially slow down the ramp rates of the first voltage v1 and the second voltage v2, which increases the time needed for the voltages v1 and v2 to separate and the regeneration stage 460 to make a bit decision (i.e., resolve a bit). The increased time needed to make a bit decision reduces the frequency at which the comparator 405 can operate, and therefore reduces the rate at which data can be transferred using the comparator 405.

To address this, aspects of the present disclosure reduce parasitic capacitances using series transistors to provide DFE, in which the series transistors are coupled in series with the transistors of the input differential pair, and the gates of the series transistors are coupled to one or more feedback differential pairs. The series transistors help isolate the signal paths of the input stage from the parasitic capacitances of the one or more feedback differential pairs, thereby reducing the capacitive loading on the signal paths. The reduced capacitive loading allows for higher data rates. The above features and other features according to aspects of the present disclosure are discussed further below.

Figure 6:
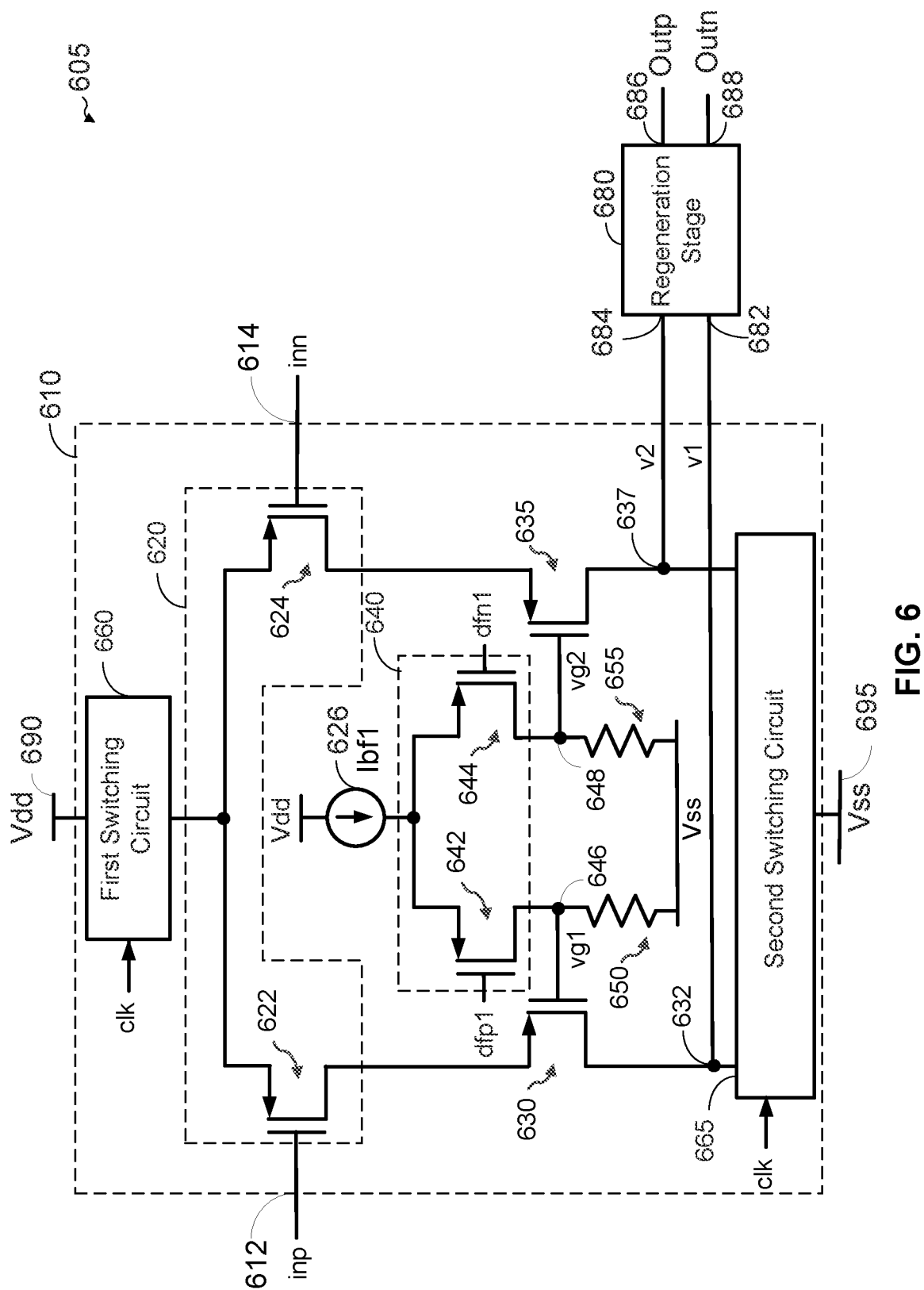
FIG. 6 shows an example of a comparator including series DFE according to certain aspects of the present disclosure.

FIG. 6 shows an example of a comparator 605 according to aspects of the present disclosure. The comparator 605 is configured to receive a differential input signal including a first signal inp and a second signal inn, and make bit decisions (i.e., resolve data bits) based on the differential input signal. The comparator 605 may also be used for a pseudo differential signal, as discussed further below.

The comparator 605 includes an input stage 610 and a regeneration stage 680. The input stage 610 is configured to receive the differential input signal, and generate a first voltage v1 and a second voltage v2 based on the differential input signal. The regeneration stage 460 is configured to resolve data bits based on the first voltage v1 and the second voltage v2, as discussed further below.

The input stage 610 includes an input differential pair 620, a feedback differential pair 640, a current source 626, a first resistor 650, a second resistor 655, a first switching circuit 660, and a second switching circuit 665.

In this example, the input differential pair 620 includes a first transistor 622 and a second transistor 624. The gate of the first transistor 622 is coupled to a first input 612 of the input stage 610 configured to receive the first signal inp (e.g., first input voltage). The gate of the second transistor 624 is coupled to a second input 614 of the input stage 610 configured to receive the second input signal inn (e.g., second input voltage). Thus, the first and second transistors 622 and 624 are driven by the differential input signal. The first transistor 622 is configured to produce a first current based on the first input signal inp, and the second transistor 624 is configured to produce a second current based on the second input signal inn.

In the example shown in FIG. 6, each of the first transistor 622 and the second transistor 624 is implemented with a respective p-type field effect transistor (PFET). However, it is to be appreciated that the present disclosure is not limited to this example. For example, in other implementations, each of the first transistor 622 and the second transistor 624 may be implemented with a respective n-type field effect transistor (NFET).

In the example shown in FIG. 6, the first switching circuit 660 is coupled between a supply rail 690 and the sources of the first transistor 622 and the second transistor 624. The supply rail 690 has a supply voltage Vdd (e.g., provided by a power distribution network). The first switching circuit 660 is configured to receive the clock signal clk. As discussed further below, the first switching circuit 660 is configured to couple the sources of the first transistor 622 and the second transistor 624 to the supply rail 690 or decouple the sources of the first transistor 622 and the second transistor 624 from the supply rail 690 based on the clock signal clk (e.g., based on the logic state of the clock signal clk).

In this example, the comparator 605 also includes a third transistor 630 coupled in series with the first transistor 622, and a fourth transistor 635 coupled in series with the second transistor 624. As discussed further below, the third transistor 630 and the fourth transistor 635 are used to provide DFE. As used herein, two transistors are coupled in "series" when the channels of the transistors are coupled in series. A channel of a transistor is between the drain and the source of the transistor. The third transistor 630 may also be referred to as a first series transistor since the third transistor 630 is coupled in series with the first transistor 622, and the fourth transistor 635 may also be referred to as a second series transistor since the fourth transistor 635 is coupled in series with the second transistor 624.

In the example shown in FIG. 6, the third transistor 630 is coupled between the drain of the first transistor 622 and a first node 632, and the fourth transistor 635 is coupled between the drain of the second transistor 624 and a second node 637. In this example, the first voltage v1 is provided at the first node 632, and the second voltage v2 is provided at the second node 637. Each of the third and fourth transistors 630 and 635 may be implemented with a respective PFET, as shown in the example in FIG. 6. However, it is to be appreciated that the present disclosure is not limited to this example. For example, in other implementations, each of the third and fourth transistors 630 and 635 may be implemented with a respective NFET.

In the example shown in FIG. 6, the second switching circuit 665 is coupled between the first node 632 and a low rail 695, and coupled between the second node 637 and the low rail 695. The low rail 695 has a voltage Vss (i.e., potential) that is lower than the supply voltage Vdd of the supply rail 690. For example, the low rail 695 may be coupled to ground. The second switching circuit 665 is configured to receive the clock signal clk. As discussed further below, the second switching circuit 665 is configured to couple the first node 632 and the second node 637 to the low rail 695 or decouple the first node 632 and the second node 637 from the low rail 695 based on the clock signal clk (e.g., based on the logic state of the clock signal clk).

The feedback differential pair 640 includes a fifth transistor 642 and a sixth transistor 644. A first decision feedback signal dfp1 may be input to the gate of the fifth transistor 642 and a second decision feedback signal dfn1 may be input to the gate of the sixth transistor 644. The first decision feedback signal dfp1 may correspond to the previous bit decision of the comparator 605 and the second decision feedback signal dfn1 may correspond to the complement (i.e., inverse) of the previous bit decision of the comparator 605, or vice versa. The first decision feedback signal dfp1 and the second decision feedback signal dfn1 may come from a latch (not shown in FIG. 6) coupled to the comparator 605, in which the latch is configured to latch the previous bit decision of the comparator 605 and the complement of the previous bit decision of the comparator 605. The latch may be a set-reset (SR) latch or another type of latch.

The fifth transistor 642 is configured to produce a third current based on the first decision feedback signal dfp1, and the sixth transistor 644 is configured to generate a fourth current based on the second decision feedback signal dfn1. In the example shown in FIG. 6, each of the fifth and sixth transistors 642 and 644 is implemented with a respective PFET. However, it is to be appreciated that the present disclosure is not limited to this example. For example, in other implementations, each of the fifth and sixth transistors 642 and 644 may be implemented with a respective NFET.

The current source 626 is coupled between the supply rail 690 and the sources of the fifth transistor 642 and the sixth transistor 644. The current source 626 is configured to provide the fifth and sixth transistors 642 and 644 with a bias current Ibf1. As discussed further below, the weight given to the previous bit decision may be set by the bias current Ibf1.

The first resistor 650 is coupled between the drain of the fifth transistor 642 and the low rail 695, and the second resistor 655 is coupled between the drain of the sixth transistor 644 and the low rail 695. Each of the resistors 650 and 655 may be implemented with a respective passive resistor, a respective active resistor (i.e., a resistor implemented with one or more active devices), or any combination thereof.

In this example, the gate of the third transistor 630 is coupled to a third node 646 between the fifth transistor 642 and the first resistor 650, and the gate of the fourth transistor 635 is coupled to a fourth node 648 between the sixth transistor 644 and the second resistor 655. The third current of the fifth transistor 642 flows through the first resistor 650 to generate a first gate voltage vg1 for the third transistor 630 at the third node 646. The fourth current of the sixth transistor 644 flows through the second resistor 655 to generate a second gate voltage vg2 for the fourth transistor 635 at the fourth node 648. Thus, the gate voltages vg1 and vg2 applied to the gates of the third and fourth transistors 630 and 635 depend on the third current and the fourth current, which, in turn, depend on the first decision feedback signal dfp1 and the second decision feedback signal dfn1.

The regeneration stage 680 has a first input 682, a second input 684, a first output 686, and a second output 688. The first input 682 is coupled to the first node 632 of the input stage 610, and the second input 684 is coupled to the second node 637 of the input stage 610. The regeneration stage 680 is configured to receive the first voltage v1 and the second voltage v2 via the first and second inputs 682 and 684, and make bit decisions based on the first voltage v1 and the second voltage v2, as discussed further below. The first output 686 and the second output 688 may be coupled to the latch discussed above (e.g., a set-reset (SR) latch or another type of latch).

Exemplary operations of the comparator 605 will now be discussed according to certain aspects. For ease of discussion, exemplary operations of the comparator 605 without DFE are discussed first followed by a discussion of exemplary operations of the comparator 605 with DFE.

In certain aspects, the comparator 605 resolves a bit value during each cycle (i.e., period) of the clock signal clk. For each clock cycle, the comparator 605 may operate in a reset phase when the clock signal clk is high, and operate in a sensing phase when the clock signal clk is low, or vice versa. The sensing phase may also be referred to as an integration phase or another term.

During the reset phase of each clock cycle, the first switching circuit 660 is configured to decouple the sources of the first and second transistors 622 and 624 from the supply rail 690, and the second switching circuit 665 is configured to couple the first node 632 and the second node 637 to the low rail 695. This causes the capacitance on the first node 632 to discharge to the low rail 695 through the second switching circuit 665, and the capacitance on the second node 637 to discharge to the low rail 695 through the second switching circuit 665. As a result, the second switching circuit 665 resets the first node 632 and the second node 637 to the voltage Vss of the low rail 695 during the reset phase. For the example where the low rail 695 is coupled to ground, the first node 632 and the second node 637 are reset to ground. The capacitances on the first node 632 and the second node 637 may include capacitances from the first and second inputs 682 and 684 of the regeneration stage 680.

During the sensing phase of each clock cycle, the first switching circuit 660 is configured to couple the sources of the first and second transistors 622 and 624 to the supply rail 690, and the second switching circuit 665 is configured to decouple the first node 632 and the second node 637 from the low rail 695. This allows the first transistor 622 to produce the first current based on the first input signal inp, and the second transistor 624 to produce the second current based on the second input signal inn. The first current charges the capacitance on the first node 632, causing the first voltage v1 to increase (i.e., ramp up). The second current charges the second capacitance on the node 637, causing the second voltage v2 to increase (i.e., ramp up). The first voltage v1 and the second voltage v2 increase (i.e., ramp up) at different rates depending on the first current and the second current, which, in turn, depend on the first input signal inp and the second input signal inn. The regeneration stage 680 then makes a bit decision (i.e., determines a bit value) based on which one of the first voltage v1 and the second voltage v2 rises faster, as discussed further below.

When the first input signal inp is greater than the second input signal inn during the sensing phase of a clock cycle, the second current is greater than the first current. In this case, the second node 637 charges faster than the first node 632, causing the second voltage v2 at the second node 637 to increase (i.e., ramp up) faster than the first voltage v1 at the first node 632. As a result, the first voltage v1 and the second voltage v2 separate in which the second voltage v2 is greater than the first voltage v1. In this example, the regeneration stage 680 may be configured to resolve (i.e., determine) a bit value of one when the second voltage v2 ramps up faster than the first voltage v1, or vice versa. The regeneration stage 680 may output the resolved bit value at the first output 686 and output the complement of the resolved bit value at the second output 688.

When the second input signal inn is greater than the first input signal inp during the sensing phase of a clock cycle, the first current is greater than the second current. In this case, the first node 632 charges faster than the second node 637, causing the first voltage v1 at the first node 632 to increase (i.e., ramp up) faster than the second voltage v2 at the second node 637. As a result, the first voltage v1 and the second voltage v2 separate in which the first voltage v1 is greater than the second voltage v2. In this example, the regeneration stage 680 may be configured to resolve (i.e., determine) a bit value of zero when the first voltage v1 ramps up faster than the second voltage v2, or vice versa. The regeneration stage 680 may output the resolved bit value at the first output 686 and output the complement of the resolved bit value at the second output 688.

Exemplary operations of the comparator 605 with DFE provided by the feedback differential pair 640 and the third and fourth transistors 630 and 635 will now be discussed according to certain aspects. As discussed above, the fifth transistor 642 produces a third current based on the first decision feedback signal dfp1 and the sixth transistor 644 produces the fourth current based on the second decision feedback signal dfn1. The third current flows through the first resistor 650 to generate the first gate voltage vg1, which is input to the gate of the third transistor 630. The first gate voltage vg1 controls the conductance of the third transistor 630, which adjusts the ramp rate of the first voltage v1 at the first node 632. Since the first gate voltage vg1 depends on the third current (which, in turn, depends on the first decision feedback signal dfp1), the adjustment to the ramp rate of the first voltage v1 by the third transistor 630 depends on the first decision feedback signal dfp1.

The fourth current flows through the second resistor 655 to generate the second gate voltage vg2 input to the gate of the fourth transistor 635. The second gate voltage vg2 controls the conductance of the fourth transistor 635, which adjusts the ramp rate of the second voltage v2 at the second node 637. Since the second gate bias voltage vg2 depends on the fourth current (which, in turn, depends on the second decision feedback signal dfn1), the adjustment to the ramp rate of the second voltage v2 by the fourth transistor 635 depends on the second decision feedback signal dfn1.

Thus, in this example, the feedback differential pair 640 and the third and fourth transistors 630 and 635 provide DFE by adjusting the ramp rates of the first voltage v1 and the second voltage v2 based on the first decision feedback signal dfp1 and the second decision feedback signal dfn1. The weight of the DFE may be set by the bias current Ibf1 of the current source 626. In this regard, the current source 626 may be implemented with a programmable current source 626 in which the bias current Ibf1 may be programmed based on a desired weight for the DFE. The desired weight may be determined, for example, based on the characteristics (e.g., frequency response) of the link (e.g., link 130) coupled to the inputs 612 and 614 of the comparator 605.

The comparator 605 reduces capacitive loading on the signal paths of the input stage 610 compared to the parallel DFE, approach in FIG. 4, in which the first node 632 and the second node 637 are in the signal paths. This is because the third and fourth transistors 630 and 635 help isolate the signal paths from the parasitic capacitances of the feedback differential pair 640, thereby reducing the capacitive loading on the signal paths. The reduced capacitive loading allows the comparator 605 to operate at higher frequencies for higher data rates. In contrast, in the approach illustrated in FIG. 4, the feedback differential pair 430 is coupled in parallel with the input differential pair 420, in which the parasitic capacitances of the feedback differential pair 430 are coupled directly to the nodes 412 and 414, which may result in a substantial increase in the capacitive loading.

For the example where the first decision feedback signal dfp1 corresponds to the previous bit decision of the comparator 605, the first decision feedback signal dfp1 may have a voltage approximately equal to the supply voltage Vdd when the previous bit decision has a bit value of one, and a voltage approximately equal to the voltage Vss (e.g., ground) of the low rail 695 when the previous bit decision has a bit value of zero. For the example where the second decision feedback signal dfn1 corresponds to the complement of the previous bit decision of the comparator 605, the second decision feedback signal dfn1 may have a voltage approximately equal to the supply voltage Vdd when the complement of the previous bit decision has a bit value of one, and a voltage approximately equal to the voltage Vss (e.g., ground) of the low rail 695 when the complement of the previous bit decision has a bit value of zero. However, it is to be appreciated that the present disclosure is not limited to this example.

For example, in some implementations, the first decision feedback signal dfp1 may have a voltage above a threshold when the previous bit decision has a bit value of one, and a voltage below the threshold when the previous bit decision has a bit value of zero. Also, in this example, the second decision feedback signal dfn1 may have a voltage above the threshold when the complement of the previous bit decision has a bit value of one, and a voltage below the threshold when the complement of the previous bit decision has a bit value of zero. Thus, the voltage of the first decision feedback signal dfp1 need not fully reach Vdd or Vss, and the voltage of the second decision feedback signal dfn1 need not fully reach Vdd or Vss. For example, the voltage of the first decision feedback signal dfp1 and the voltage of the second decision feedback signal dfn1 may be enough to steer most of the bias current Ibf1 to one of the first resistor 650 and the second resistor 655 based on the previous bit decision and its complement without having to fully reach Vdd or Vss.

Figure 7:
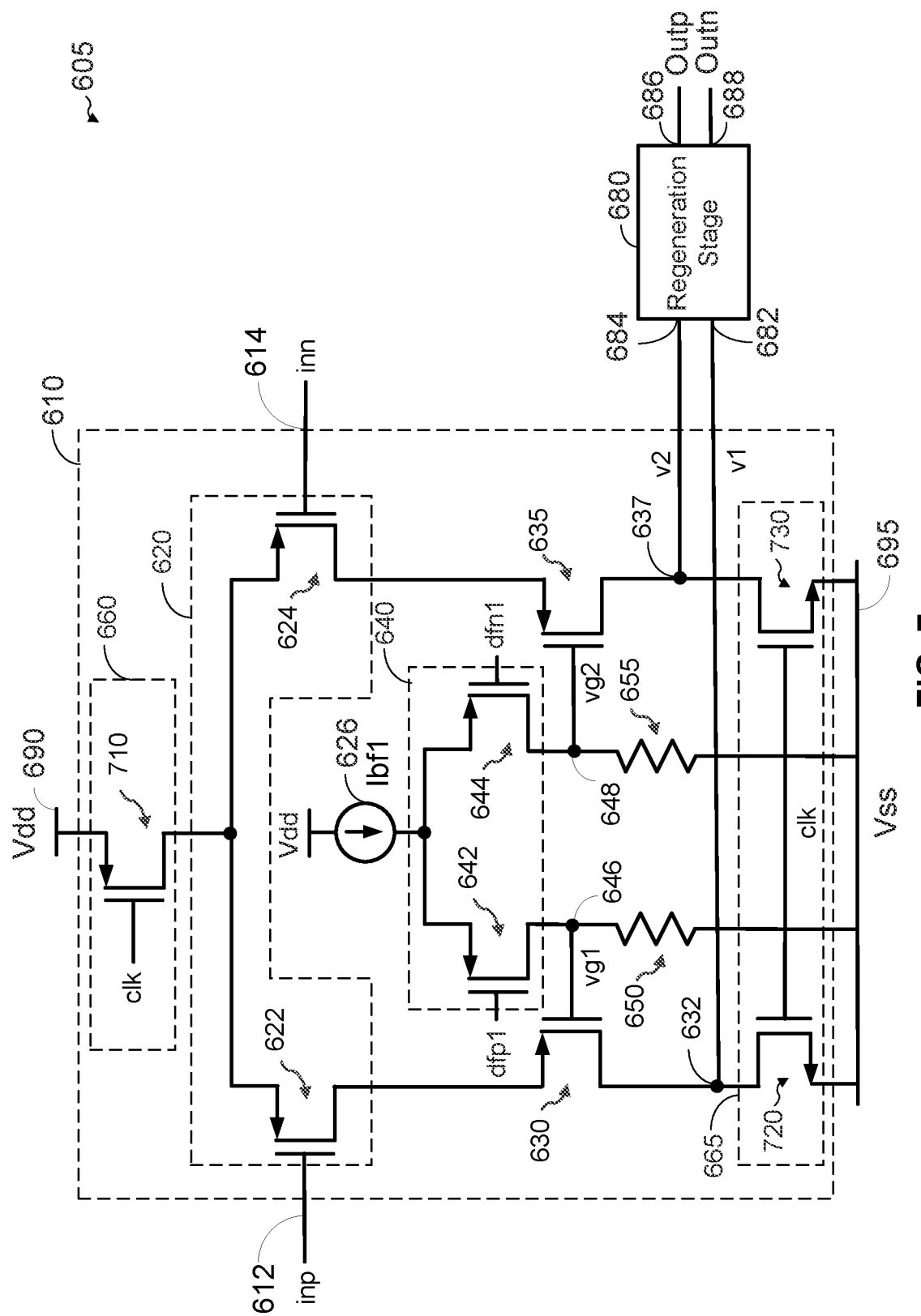
FIG. 7 shows an exemplary implementation of a first switching circuit and a second switching circuit according to certain aspects of the present disclosure.

FIG. 7 shows an exemplary implementation of the first switching circuit 660 and the second switching circuit 665 according to certain aspects. In this example, the first switching circuit 660 includes a first switch 710 coupled between the sources of the first and second transistors 622 and 624 and the supply rail 690. In the example shown in FIG. 6, the first switch 710 is implemented with a PFET in which the gate of the PFET is driven by the clock signal clk. However, it is to be appreciated that the present disclosure is not limited to this example, and that the first switch 710 may be implemented with an NFET, a transmission gate, or another type of switch. It is also to be appreciated that the first switching circuit 660 is not limited to the first switch 710 shown in FIG. 7. In general, the first switching circuit 660 may be implemented with one or more switches arranged to perform the switching functions of the first switching circuit 660 described herein according to various aspects.

In this example, the second switching circuit 665 includes a second switch 720 and a third switch 730 where the second switch 720 is coupled between the first node 632 and a low rail 695, and the third switch 730 is coupled between the second node 637 and the low rail 695. In the example shown in FIG. 7, each of the second and third switches 720 and 730 is implemented with a respective NFET in which the gate of the respective NFET is driven by the clock signal clk. However, it is to be appreciated that the present disclosure is not limited to this example, and that each of the second and third switches 720 and 730 may be implemented with a respective PFET, a transmission gate, or another type of switch. It is also to be appreciated that the second switching circuit 665 is not limited to the second and third switches 720 and 730 shown in FIG. 7. In general, the second switching circuit 665 may be implemented with one or more switches arranged to perform the switching functions of the second switching circuit 665 described herein according to various aspects.

It is to be appreciated that the input stage 610 may include one or more additional components not shown in FIGS. 6 and 7. For example, in some implementations, the input stage 610 may include one or more additional reset switches (not shown) configured to reset the node between the first transistor 622 and the third transistor 630 to Vss (e.g., ground) during the reset phase, and reset the node between the second transistor 624 and the fourth transistor 635 to Vss (e.g., ground) during the reset phase. In some implementations, the comparator 605 may include additional components (not shown) for offset cancelation. Thus, it is to be appreciated that the input stage 610 is not limited to the components shown in FIGS. 6 and 7.

Figure 8:
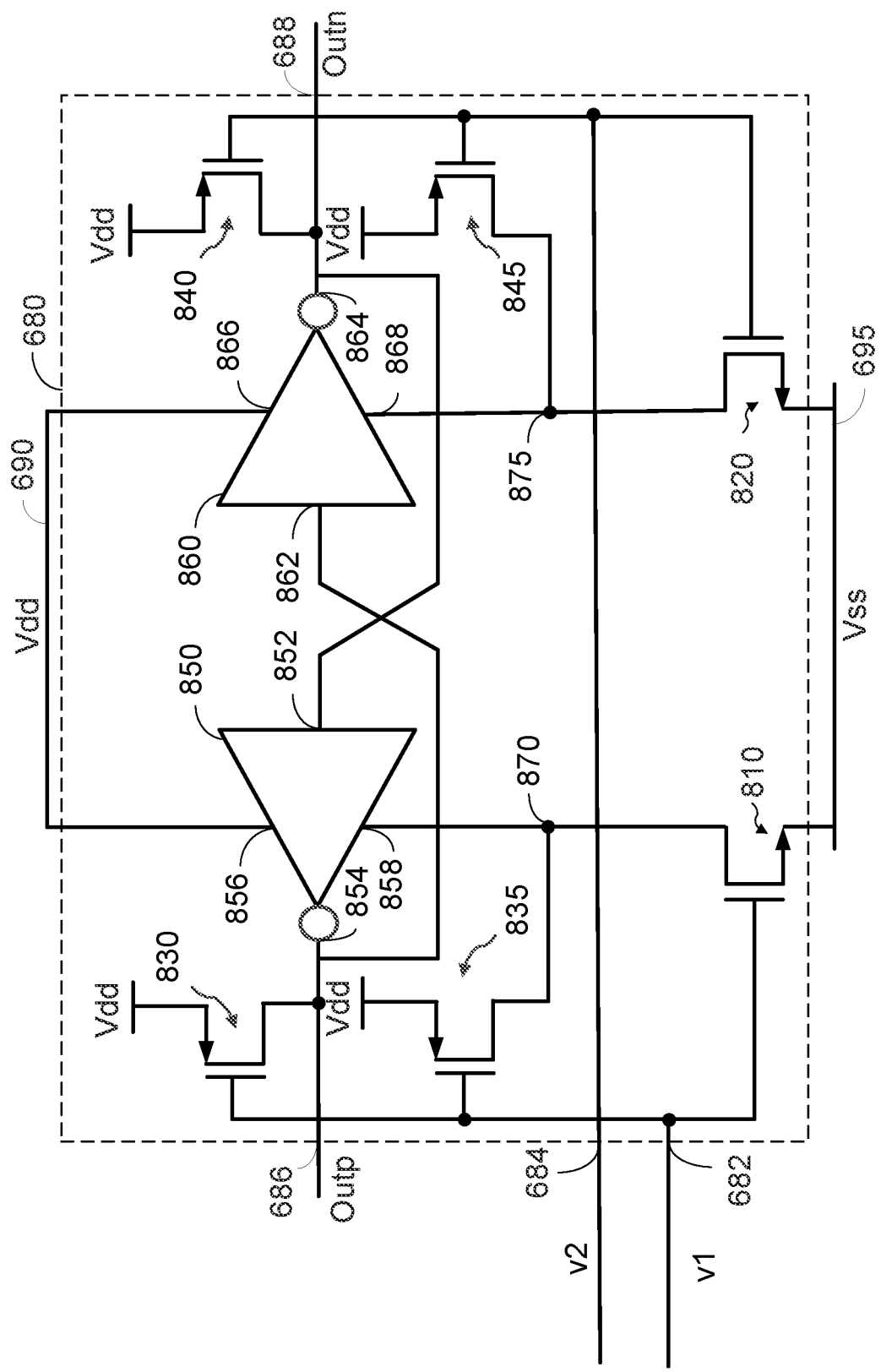
FIG. 8 shows an exemplary implementation of a regeneration stage according to certain aspects of the present disclosure.

FIG. 8 shows an exemplary implementation of the regeneration stage 680 according to certain aspects. In this example, the regeneration stage 680 includes a first inverter 850, a second inverter 860, a first drive transistor 810, a second drive transistor 820, a first transistor 830, a second transistor 835, a third transistor 840, and a fourth transistor 845.

The first inverter 850 and the second inverter 860 are cross coupled to form a latch in which the input 852 of the first inverter 850 is coupled to the output 864 of the second inverter 860, and the input 862 of the second inverter 860 is coupled to the output 854 of the first inverter 850. As discussed further below, the cross coupling of the first inverter 850 and the second inverter 860 provides regenerative feedback to help resolve a bit (i.e., make a bit decision). In the example shown in FIG. 8, the first output 686 is coupled to the output 854 of the first inverter 850, and the second output 688 is coupled to the output 864 of the second inverter 860. However, it is to be appreciated that the present disclosure is not limited to this example, and that the first output 686 and the second output 688 may be coupled to other nodes in the regeneration stage 680.

The first inverter 850 also has a first voltage terminal 856 and a second voltage terminal 858. The first voltage terminal 856 is coupled to the supply rail 690 and the second voltage terminal 858 is coupled to a first node 870. The first inverter 850 is configured to pull the output 854 to approximately the voltage at the first voltage terminal 856 (e.g., supply voltage Vdd) when the input 852 is low and pull the output 854 to approximately the voltage at the second voltage terminal 858 when the input 852 is high.

The second inverter 860 also has a first voltage terminal 866 and a second voltage terminal 868. The first voltage terminal 866 is coupled to the supply rail 690 and the second voltage terminal 868 is coupled to a second node 875. The second inverter 860 is configured to pull the output 864 to approximately the voltage at the first voltage terminal 866 (e.g., supply voltage Vdd) when the input 862 is low and pull the output 864 to approximately the voltage at the second voltage terminal 868 when the input 862 is high.

The drain of the first drive transistor 810 is coupled to the first node 870, the gate of the first drive transistor 810 is coupled to the first input 682, and the source of the first drive transistor 810 is coupled to the low rail 695 (e.g., ground). The drain of the second drive transistor 820 is coupled to the second node 875, the gate of the second drive transistor 820 is coupled to the second input 684, and the source of the second drive transistor 820 is coupled to the low rail 695 (e.g., ground). In the example in FIG. 8, each of the drive transistors 810 and 820 is implemented with a respective NFET.

The first transistor 830 is coupled between the supply rail 690 and the output 854 of the first inverter 850, and the second transistor 835 is coupled between the supply rail 690 and the first node 870. The gate of each of the first and second transistors 830 and 835 is coupled to the first input 682. The third transistor 840 is coupled between the supply rail 690 and the output 864 of the second inverter 860, and the fourth transistor 845 is coupled between the supply rail 690 and the second node 875. The gate of each of the third and fourth transistors 840 and 845 is coupled to the second input 684. In the example in FIG. 8, each of the transistors 830, 835, 840, and 845 is implemented with a respective PFET.

Exemplary operations of the regeneration stage 680 shown in the example in FIG. 8 will now be discussed according to certain aspects.

During the reset phase of a clock cycle, the first input 682 and the second input 684 are pulled down to the voltage Vss (e.g., ground) of the low rail 692. This is because the first node 632 and the second node 637 in the input stage 610 are reset to the voltage Vss of the low rail 692, as discussed above with reference to FIG. 6. The pulling down of the first input 682 and the second input 684 causes the transistors 830, 835, 840, and 845 to turn on. The turning on of the transistors 830, 835, 840, and 845 causes the first transistor 830 to reset the output 854 of the first inverter 850 high (e.g., Vdd) and the input 862 of the second inverter 860 high (e.g., Vdd), the second transistor 835 to reset the first node 870 high (e.g., Vdd), the third transistor 840 to reset the output 864 of the second inverter 860 high (e.g., Vdd) and the input 852 of the first inverter 150 high (e.g., Vdd), and the fourth transistor 845 to reset the second node 875 high (e.g., Vdd). Also, the first drive transistor 810 and the second drive transistor 820 are turned off.

During the sensing phase of a clock cycle, the first drive transistor 810 is driven by the first voltage v1 from the input stage 610, and the second drive transistor 820 is driven by the second voltage v2 from the input stage 610. The first drive transistor 810 or the second drive transistor 820 turns on first during the sensing phase depending on which one of the first voltage v1 and the second voltage v2 has the faster (i.e., higher) ramp rate.

When the first voltage v1 has a higher ramp rate than the second voltage v2, the first drive transistor 810 turns on before the second drive transistor 820. In this case, the first drive transistor 810 couples the second voltage terminal 858 of the first inverter 850 to Vss (e.g., ground), which enables the first inverter 850. This causes the first inverter 850 to turn on and pull the output 854 of the first inverter 850 low. The first inverter 850 pulls the output 854 low since the input 852 was reset high (e.g., Vdd) during the reset phase. Since the output 854 of the first inverter 850 is coupled to the input 862 of the second inverter 860, the input 862 of the second inverter 860 is also pulled low. When the second drive transistor 820 turns on, the second inverter 860 turns on and pulls the output 864 of the second inverter 860 high since the input 862 of the second inverter 860 is pulled low by the output 854 of the first inverter 850. Thus, in this example, the first output 686 is pulled low, representing a bit decision of zero. Also, the second output 688 is pulled high, representing a bit decision of one (i.e., the complement of zero).

When the second voltage v2 has a higher ramp rate than the first voltage v1, the second drive transistor 820 turns on before the first drive transistor 810. In this case, the second drive transistor 820 couples the second voltage terminal 868 of the second inverter 860 to Vss (e.g., ground), which enables the second inverter 860. This causes the second inverter 860 to turn on and pull the output 864 of the second inverter 860 low. The second inverter 860 pulls the output 864 low since the input 862 was reset high (e.g., Vdd) during the reset phase. Since the output 864 of the second inverter 860 is coupled to the input 852 of the first inverter 850, the input 852 of the first inverter 850 is also pulled low. When the first drive transistor 810 turns on, the first inverter 850 turns on and pulls the output 854 of the first inverter 850 high since the input 852 of the first inverter 850 is pulled low by the output 864 of the second inverter 860. Thus, in this example, the first output 686 is pulled high, representing a bit decision of one. Also, the second output 688 is pulled low, representing a bit decision of zero (i.e., the complement of one).

Figure 9:
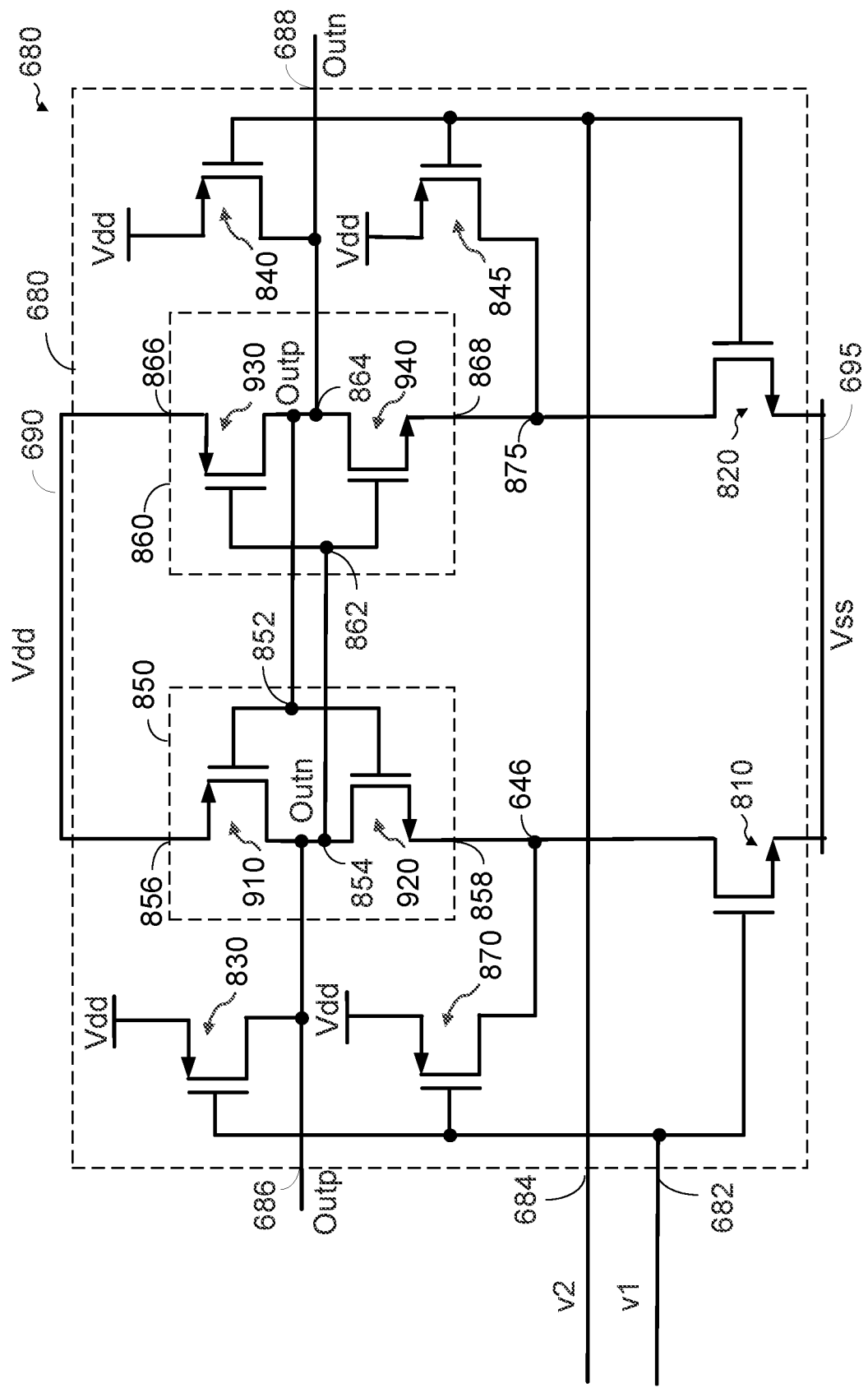
FIG. 9 shows an exemplary implementation of inverters in a regeneration stage according to certain aspects of the present disclosure.

FIG. 9 shows an exemplary implementation of the first inverter 850 and the second inverter 860 according to certain aspects. In this example, each of the inverters 850 and 860 includes a complementary pair of transistors.

More particularly, the first inverter 850 includes a respective PFET 910 and a respective NFET 920. The source of the PFET 910 is coupled to the first voltage terminal 856, the drain of the PFET 910 is coupled to the output 854, and the gate of the PFET 910 is coupled to the input 852. The source of the NFET 920 is coupled to the second voltage terminal 858, the drain of the NFET 920 is coupled to the output 854, and the gate of the NFET 920 is coupled to the input 852.

The second inverter 860 includes a respective PFET 930 and a respective NFET 940. The source of the PFET 930 is coupled to the first voltage terminal 866, the drain of the PFET 930 is coupled to the output 864, and the gate of the PFET 930 is coupled to the input 862. The source of the NFET 940 is coupled to the second voltage terminal 868, the drain of the NFET 940 is coupled to the output 864, and the gate of the NFET 940 is coupled to the input 862.

FIGS. 6 and 7 show an example of 1-tap DFE in which the first decision feedback signal dfp1 and the second decision feedback signal dfn1 correspond to the most recent previous bit decision and its complement. However, it is to be appreciated that the comparator 605 may be expanded to multi-tap DFE to provide DFE based on additional previous bit decisions (i.e., bit decisions corresponding to earlier clock cycles). This may be achieved by coupling additional feedback differential pairs to the third node 646 and the fourth node 648 where each one of the additional feedback differential pairs provides feedback for a respective one of the additional previous bit decisions. The third and fourth transistors 630 and 635 help isolate the signal paths of the input stage 610 from the parasitic capacitances of the additional feedback differential pairs. Thus, the third and fourth transistors 630 and 635 allow additional feedback differential pairs to be added (i.e., additional taps for the DFE) with little to no impact on the capacitive loading on the signal paths.

Figure 10:
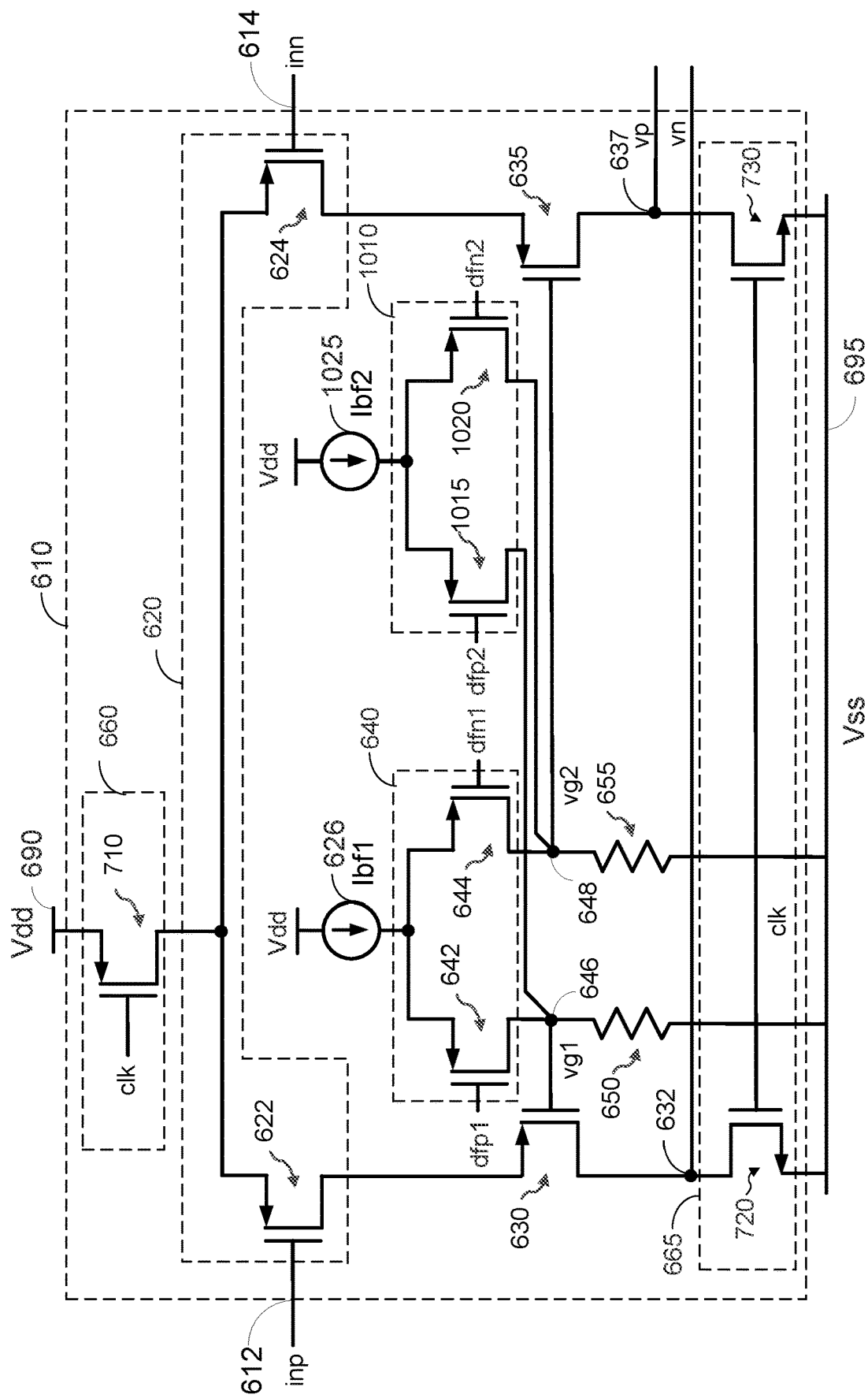
FIG. 10 shows an example of a comparator including series DFE with multiple taps according to certain aspects of the present disclosure.

FIG. 10 shows an example in which the comparator 605 includes a second current source 1025 and a second feedback differential pair 1010 to implement multi-tap DFE. In this example, the second feedback differential pair 1010 is coupled to the third node 646 and the fourth node 648 to provide feedback for a second previous bit decision (i.e., the bit decision corresponding to two clock cycles preceding the current clock cycle).

In this example, the second feedback differential pair 1010 includes a seventh transistor 1015 and an eighth transistor 1020. A third decision feedback signal dfp2 may be input to the gate of the seventh transistor 1015 and a fourth decision feedback signal dfn2 may be input to the gate of the eighth transistor 1020. The third decision feedback signal dfp2 may correspond to the second previous bit decision and the fourth decision feedback signal dfn2 may correspond to the complement (i.e., inverse) of the second previous bit decision, or vice versa.

The drain of the seventh transistor 1015 is coupled to the third node 646, and the drain of the eighth transistor 1020 is coupled to the fourth node 648. The seventh transistor 1015 is configured to produce a fifth current based on the third decision feedback signal dfp2, and the eighth transistor 1020 is configured to generate a sixth current based on the fourth decision feedback signal dfn2. In the example shown in FIG. 10, each of the seventh and eighth transistors 1015 and 1020 is implemented with a respective PFET. However, it is to be appreciated that the present disclosure is not limited to this example.

The second current source 1025 is coupled between the supply rail 690 and the sources of the seventh transistor 1015 and the eighth transistor 1020. The second current source 1025 is configured to provide the seventh and eighth transistors 1015 and 1020 with a second bias current Ibf2. In certain aspects, the second current source 1025 may be implemented with a programmable current source in which to the weight given to the second previous bit decision may be set to a desired weight by programming the second bias current Ibf2 accordingly.

In this example, the fifth current from the seventh transistor 1015 is summed with the third current from the fifth transistor 642 at the third node 646. The sum of the fifth current and the third current flows through the first resistor 650 to generate the first gate voltage vg1 for the third transistor 630. Thus, the third transistor 630 adjusts the ramp rate of the first voltage v1 based on both the first feedback signal dfp1 and the third decision feedback signal dfp2.

The sixth current from the eighth transistor 1020 is summed with the fourth current from the sixth transistor 644 at the fourth node 648. The sum of the sixth current and the fourth current flows through the second resistor 655 to generate the second gate voltage vg2 for the fourth transistor 635. Thus, the fourth transistor 635 adjusts the ramp rate of the second voltage v2 based on both the second decision feedback signal dfn1 and the fourth decision feedback signal dfn2. It is to be appreciated that additional feedback differential pairs may be coupled to the third node 646 and the fourth node 648 to implement 3-tap DFE or higher tap DFE.

Figure 11:
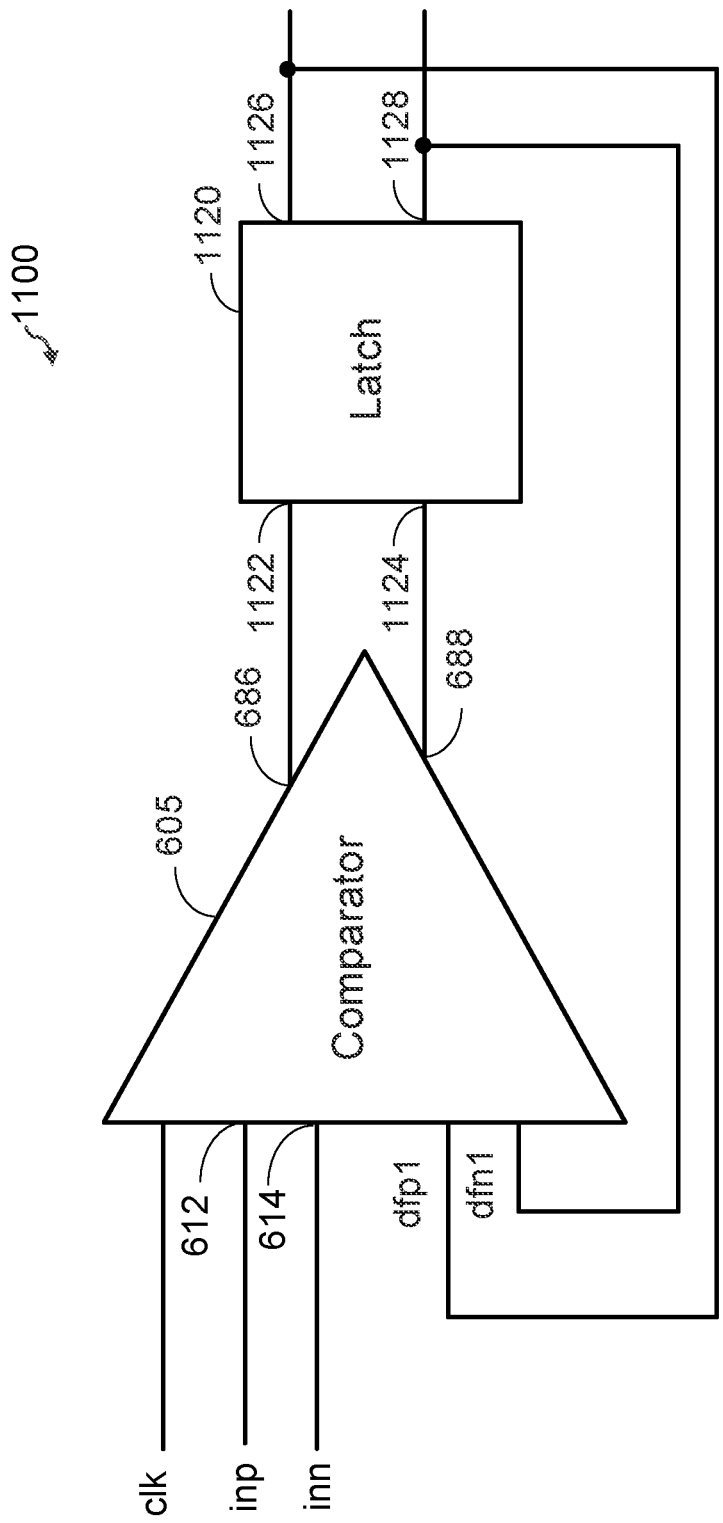
FIG. 11 shows an example of a latch coupled to a comparator according to certain aspects of the present disclosure.

FIG. 11 shows a system 1100 including the comparator 605 and a latch 1120 coupled to the comparator 605. For ease of illustration, details of the comparator 605 are not explicitly shown in FIG. 11.

The latch 1120 may include a set-reset (SR) latch or another type of latch. The latch 1120 has a first input 1122, a second input 1124, a first output 1126, and a second output 1128. In the example in FIG. 11, the first input 1122 is coupled to the first output 686 of the comparator 605, and the second input 1124 is coupled to the second output 688 of the comparator 605. For the example where the latch 1120 includes an SR latch, the first input 1122 may be a set input and the second input 1124 may be a reset input, or vice versa. The first output 1126 and the second output 1128 may be coupled to a processor, a deserializer, a memory, or another type of circuit.

In certain aspects, the latch 1120 may be configured to latch the bit value (i.e., resolved bit value) at the first output 686 and latch the complement of the bit value at the second output 688. The latch 1120 may also be configured to output the latched bit value at the first output 1126 and output the latched complement of the bit value at the second output 1128, or vice versa. In one example, during a reset phase of a cycle of the clock signal clk, the latch 1120 (e.g., SR latch) may be configured to output the latched bit value and the latched complement of the bit value from the previous clock cycle (i.e., previous bit decision and complement of the previous bit decision).

In the example shown in FIG. 11, the first decision feedback signal dfp1 and the second decision feedback signal dfn1 used for DFE in the comparator 605 may be provided by the first output 1126 and the second output 1128 of the latch 1120. For example, the first output 1126 of the latch 1120 may be coupled to the gate of the fifth transistor 642 (shown in FIG. 6) to provide the first decision feedback signal dfp1 and the second output 1128 of the latch 1120 may be coupled to the gate of the sixth transistor 644 (shown in FIG. 6) to provide the second decision feedback signal dfn1, or vice versa. However, it is to be appreciated that the present disclosure is not limited to the example shown in FIG. 11. For example, in some implementations, the first decision feedback signal dfp1 and the second decision feedback signal dfn1 may be provided by internal nodes in the latch 1120.

Figure 12:
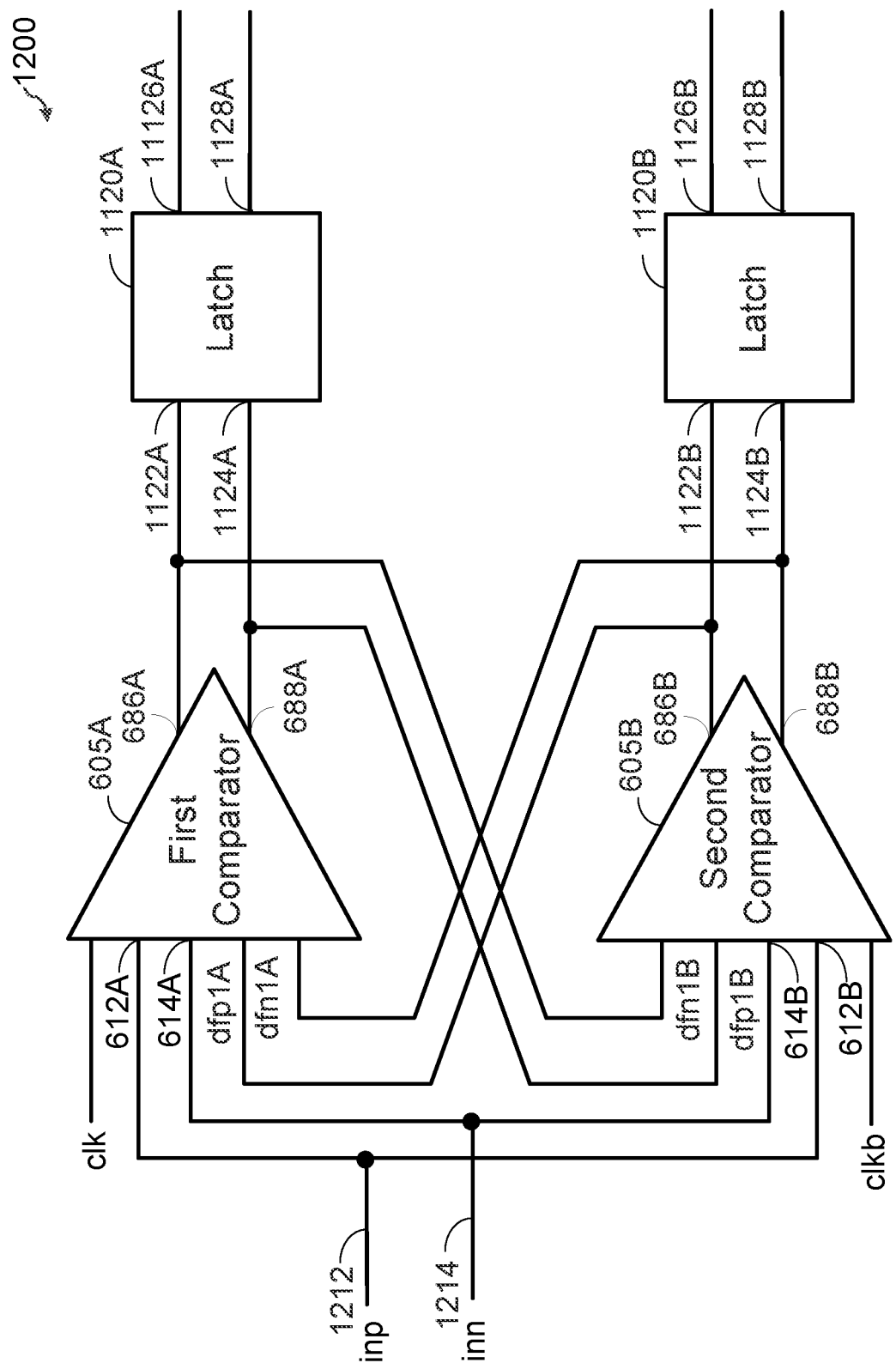
FIG. 12 shows an example of a receiver including time-interleaved comparators according to certain aspects of the present disclosure.

FIG. 12 shows an example of a receiver 1200 having a half-rate architecture according to certain aspects. The receiver 1200 includes a first comparator 605A, a second comparator 605B, a first latch 1120A, and a second latch 1120B. Each of the first comparator 605A and the second comparator 605B may be a separate instance of the comparator 605 and may be implemented, for example, with any of the exemplary implementations discussed herein. In the example in FIG. 12, the reference numbers for the elements of the first comparator 605A are appended with an "A" and the reference numbers for the elements of the second comparator 605B are appended with a "B".

The first input 612A of the first comparator 605A and the first input 612B of the second comparator 605B are coupled to a first input 1212 of the receiver 1200. The first input 1212 is configured to receive the first input signal inp of the differential input signal. The second input 614A of the first comparator 605A and the second input 614B of the second comparator 605B are coupled to a second input 1214 of the receiver 1200. The second input 1214 is configured to receive the second input signal inn of the differential input signal.

In this example, the first comparator 605A receives the clock signal clk, and the second comparator 605B receives the complementary clock signal clkb (i.e., the complement of the clock signal clk). Thus, the clock signal clk clocks the switches 710A, 720A, and 730A (not shown in FIG. 12) in the first comparator 605A, and the complementary clock signal clkb clocks the switches 710B, 720B, and 730B (not shown in FIG. 12) in the second comparator 605B. This causes the first comparator 605A and the second comparator 605B to alternately resolve bit values based on the differential input signal. In other words, the first comparator 605A and the second comparator 605B resolve the bit values in a time-interleaved fashion. For example, the first comparator 605A may resolve even bit values and the second comparator 605B may resolve odd bit values, or vice versa. Thus, the last bit value resolved by the second comparator 605B may correspond to a previous bit decision with respect to the first comparator 605A, and the last bit value resolved by the first comparator 605A may correspond to a previous bit decision with respect to the second comparator 605B.

In the example in FIG. 12, the first latch 1120A (e.g., first SR latch) has a first input 1122A coupled to the first output 686A of the first comparator 605A, a second input 1124A coupled to the second output 688A of the first comparator 605A, a first output 1126A, and a second output 1128A. The first output 1126A and the second output 1128A may be coupled to a processor, a deserializer, a memory, or another type of circuit. The first latch 1120A may be configured to latch the bit value at the first output 686A of the first comparator 605A and latch the complement of the bit value at the second output 688A of the first comparator 605A. The first latch 1120A may also be configured to output the latched bit value at the first output 1126A and output the latched complement of the bit value at the second output 1128A, or vice versa.

The second latch 1120B (e.g., second SR latch) has a first input 1122B coupled to the first output 686B of the second comparator 605B, a second input 1124B coupled to the second output 688B of the second comparator 605B, a first output 1126B, and a second output 1128B. The first output 1126B and the second output 1128B may be coupled to a processor, a deserializer, a memory, or another type of circuit. The second latch 1120B may be configured to latch the bit value at the first output 686B of the second comparator 605B and latch the complement of the bit value at the second output 688B of the second comparator 605B. The second latch 1120B may also be configured to output the latched bit value at the first output 1126B and output the latched complement of the bit value at the second output 1128B, or vice versa.

In the example shown in FIG. 12, the first decision feedback signal dfp1A and the second decision feedback signal dfn1A used for decision feedback equalization in the first comparator 605A are provided by the first output 686B and the second output 688B of the second comparator 605B.

It is to be appreciated that, in other implementations, the first decision feedback signal dfp1A and the second decision feedback signal dfn1A may be provided by a first internal node and a second internal node, respectively, of the second comparator 605B or the second latch 1120B.

In the example shown in FIG. 12, the first decision feedback signal dfp1B and the second decision feedback signal dfn1B used for decision feedback equalization in the second comparator 605B are provided by the first output 686A and the second output 688A of the first comparator 605A. It is to be appreciated that, in other implementations, the first decision feedback signal dfp1B and the second decision feedback signal dfn1B may be provided by a first internal node and a second internal node, respectively, of the first comparator 605A or the first latch 1120A.

For the example of 2-tap DFE, each of the first and second comparators 605A and 605B may receive the respective third feedback signal dfp2 and fourth feedback signal dfn1 from the respective latch 1120A and 1120B. Thus, in this example, for the first comparator 605A, the first and second feedback signal dfp1 and dfn1 may be based on a previous bit decision of the second comparator 605B, and the third and fourth feedback signals dfp2 and defn2 may be based on a previous bit decision by the first comparator 605A. Similarly, for the second comparator 605B, the first and second feedback signal dfp1 and dfn1 may be based on a previous bit decision of the first comparator 605A, and the third and fourth feedback signals dfp2 and defn2 may be based on a previous bit decision by the second comparator 605B.

FIG. 13A shows an example of a system 1305 including the comparator 605 and the latch 1120 according to certain aspects of the present disclosure. In this example, the system 1305 also includes the transmitter 112 and the link 130 (e.g., a differential serial link) discussed above with reference to FIG. 1. As shown in FIG. 13A, the first input 612 and the second input 614 of the comparator 605 are coupled to a first output 1322 and a second output 1324 of the transmitter 112 via respective transmission lines 1312 and 1314 of the link 130. In certain aspects, the transmitter 112 may transmit the first signal inp from the first output 1322 and transmit the second signal inn from the second output 1324.

The comparator 605 may receive the first decision feedback signal dfp1 and the second decision feedback signal dfn1 from the latch 1120 (shown in FIG. 11). In another example, the comparator 605 may receive the first decision feedback signal dfp1 and the second decision feedback signal dfn1 from another comparator that is time-interleaved with the comparator 605. In this example, the comparator 605 may correspond to the first comparator 605A and the other comparator may correspond to the second comparator 605B shown in FIG. 12, or vice versa.

The system 1305 also includes a deserializer 1310 coupled to the latch 1120 (e.g., to support SerDes communication). The deserializer 1310 may be coupled to the first output 1126 and/or the second output 1128 of the latch 1120. In this example, deserializer 1310 may be configured to receive a serial bit stream from the latch 1120 and convert the serial bit stream into multiple parallel bit streams. The parallel bit streams may be sent to a processor (not shown) for further processing.

FIG. 13B shows an example of a system 1330 including the comparator 605 and the latch 1120 according to certain aspects of the present disclosure. In this example, the system 1305 also includes the transmitter 112 and the link 130 (e.g., a differential serial link) discussed above with reference to FIG. 1. As shown in FIG. 13B, the first input 612 and the second input 614 of the comparator 605 are coupled to the first output 1322 and the second output 1234 of the transmitter 112 via the respective transmission lines 1312 and 1314 of the link 130. The comparator 605 may receive the first decision feedback signal dfp1 and the second decision feedback signal dfn1 from the latch 1120 (shown in FIG. 11), or from another comparator that is time-interleaved with the comparator 605, as discussed above with reference to FIG. 13A.

The system 1330 also includes a memory 1335 (e.g., a double-data rate (DDR) dynamic random-access memory (DRAM), a low power DDR (LPDDR) DRAM, etc.) coupled to the latch 1120. The memory 1335 may be coupled to the first output 1126 and/or the second output 1128 of the latch 1120. In this example, the memory 1335 may receive data bits, address bits, and/or control bits from the latch 1120. For the example where the memory 1335 receives data bits from the latch 1120, the memory 1335 may store the received data bits.

Figure 14:
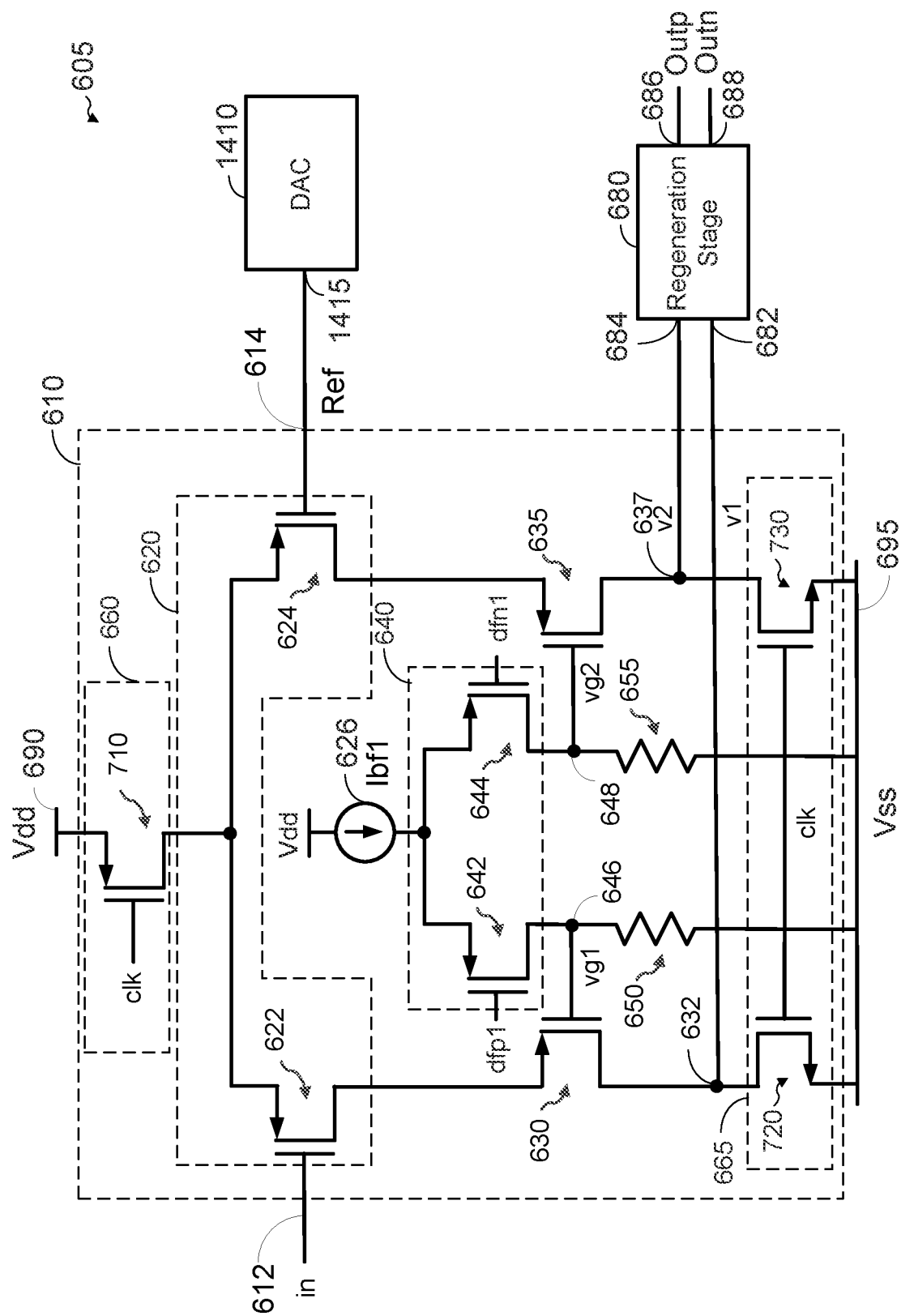
FIG. 14 shows an example of a comparator configured for a pseudo differential signal according to certain aspects of the present disclosure.

As discussed above, the comparator 605 may also be used for a pseudo differential signal. In this regard, FIG. 14 shows an example in which the comparator 605 is used for a pseudo differential signal. The pseudo differential signal includes an input signal and a reference signal. The input signal may come from a transmitter (e.g., transmitter 112) via a link (e.g., link 130). In this example, the input signal (e.g., input voltage) is input to the first input 612 of the comparator 605, and the reference signal (e.g., reference voltage) is input to the second input 614 of the comparator 605.

In this example, the comparator 605 may include a digital-to-analog converter (DAC) 1410 configured to generate the reference signal (e.g., reference voltage) based on a digital code, and output the reference signal at an output 1415 coupled to the second input 614 of the comparator 605. In this example, the reference signal may be set to a desired level (e.g., voltage level) by setting the digital code accordingly.

In this example, the comparator 605 makes a bit decision based on whether the input signal is greater than or less than the reference signal. For example, the comparator 605 may resolve a bit value of one when the input signal is greater than the reference signal, and may resolve a bit value of zero when the input signal is less than the reference signal. However, it is to be appreciated that the present disclosure is not limited to this example.

Figure 15:
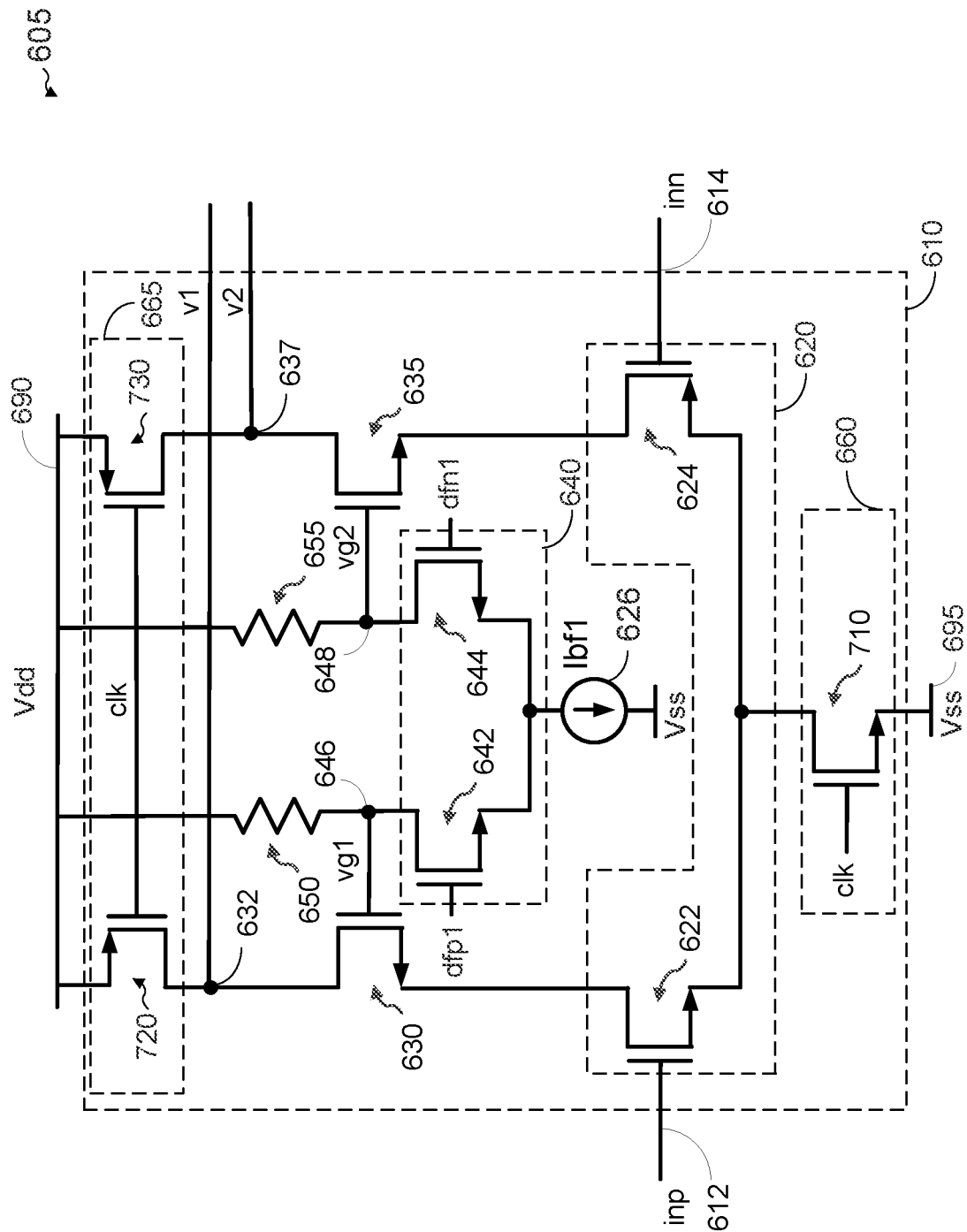
FIG. 15 shows another example of a comparator including series DFE according to certain aspects of the present disclosure.

FIG. 15 shows an example in which each of the first transistor 622, the second transistor 624, the third transistor 630, the fourth transistor 635, the fifth transistor 642, and the sixth transistor 644 is implemented with a respective NFET according to certain aspects. In this example, the first switching circuit 660 is coupled between the sources of the first transistor 622 and the second transistor 624 and the low rail 695, and the second switching circuit 665 is coupled between the first and second nodes 632 and 637 and the supply rail 690. In the example shown in FIG. 15, the first switching circuit 660 includes the first switch 710 implemented with an NFET, and the second switching circuit 665 includes the second switch 720 and the third switch 730 implemented with respective PFETs. However, it is to be appreciated that the present disclosure is not limited to this example.

In this example, the input stage 610 operates in the reset phase when the clock signal clk is low, and operates in the sensing phase when the clock signal is high. During the reset phase, the first switching circuit 660 decouples the sources of the first and second transistors 622 and 624 from the low rail 695, and the second switching circuit 665 couples the first and second nodes 632 and 637 to the supply rail 690. As a result, the capacitance of the first node 632 charges to the supply rail 690, causing the first voltage v1 to rise to approximately Vdd. Also, the capacitance of the second node 637 charges up to the supply rail 690, causing the second voltage v2 to rise to approximately Vdd. Thus, in this example, the first voltage v1 and the second voltage v2 are reset to approximately Vdd.

During the sensing phase, the first transistor 622 discharges the capacitance on the first node 632 based on the first input signal inp, causing the first voltage v1 to decrease (i.e., ramp down), and the second transistor 624 discharges the capacitance on the second node 637 based on the second input signal inn, causing the second voltage v2 decrease (i.e., ramp down). Alternately, for a pseudo differential signal, the first transistor 622 discharges the capacitance on the first node 632 based on the input signal, and the second transistor 624 discharges the capacitance on the second node 637 based on the reference signal. The first voltage v1 and the second voltage v2 ramp down at different rates depending the input signals inp and inn. For example, when the first input signal inp is higher than the second input signal inn, the first current is higher than the second current. When the second input signal inn is higher than the first input signal inp, the second current is higher than the first current. In both cases, the first current and the second current are different depending on the input signals inp and inn, causing the first voltage v1 and the second voltage v2 to ramp down at different rates and separate during the sensing phase. In this example, the regeneration stage 680 may be configured to make a bit decision of one when the first voltage v1 ramps down faster than the second voltage v2, and make a bit decision of zero when the second voltage v2 ramps down faster than the first voltage v1, or vice versa.

The third transistor 630, the fourth transistor 635, and the feedback differential pair 640 add DFE by adjusting the ramp rates of the first voltage v1 and the second voltage v2 based on the feedback signals dfp1 and dfn1, as discussed above. In this example, the current source 626 is coupled between the sources of the fifth and sixth transistors 642 and 644 and the low rail 695, the first resistor 650 is coupled between the gate of the third transistor 630 and the supply rail 690, and the second resistor 655 is coupled between the gate of the fourth transistor 635 and the supply rail 690.

In certain aspects, the reset phase of a cycle of the clock signal clk corresponds to a first portion of the cycle of the clock signal clk, and the sensing phase of the cycle of the clock signal clk corresponds to a second portion of the cycle of the clock signal. In the exemplary implementation shown in FIG. 7, the clock signal clk may be high during the first portion of the cycle of the clock signal, and low during the second portion of the cycle of the clock signal. In the exemplary implementation shown in FIG. 15, the clock signal clk may be low during the first portion of the cycle of the clock signal, and high during the second portion of the cycle of the clock signal. However, it is to be appreciated that the present disclosure is not limited to these examples.

Figure 16:
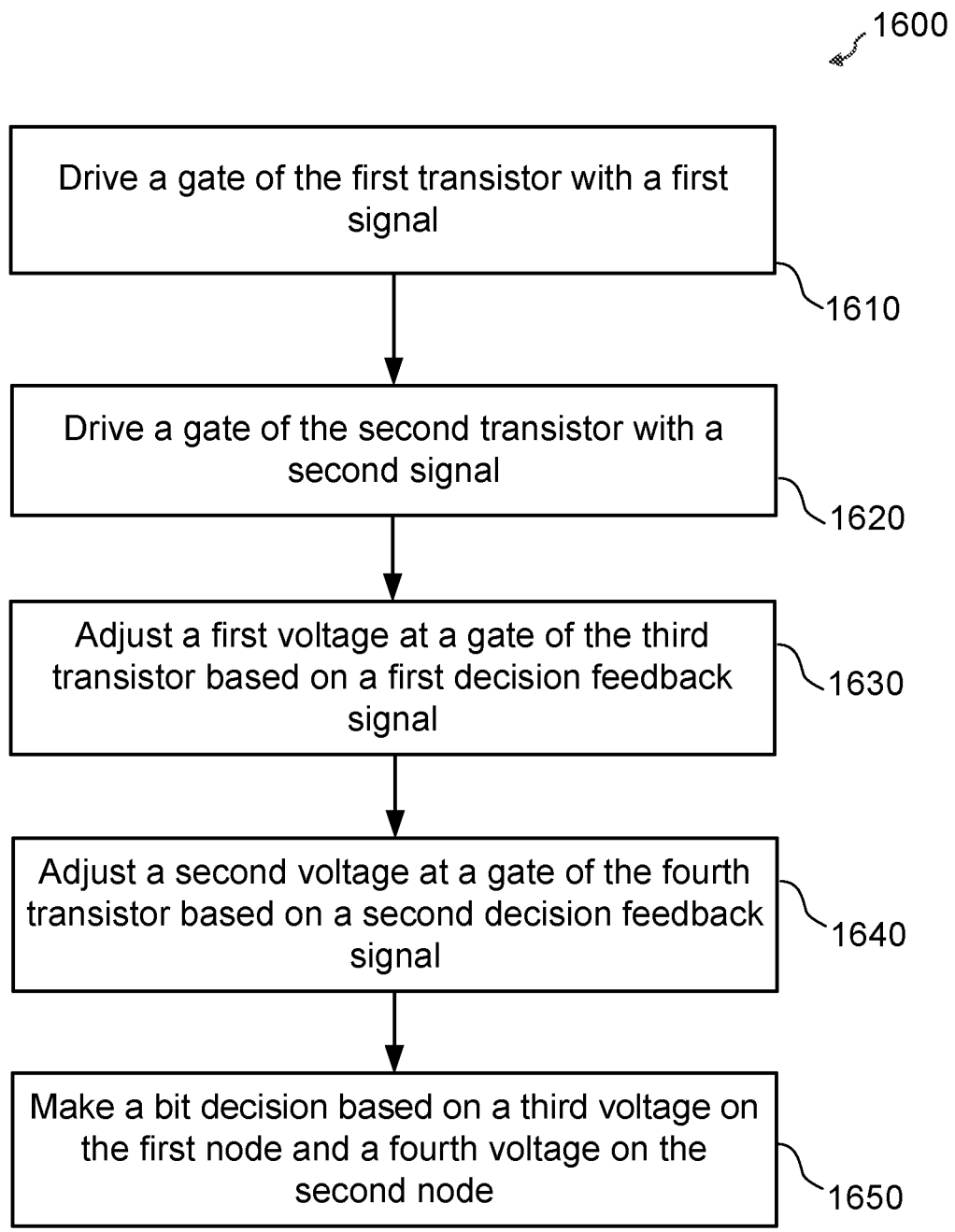
FIG. 16 is a flowchart illustrating a method of operating a comparator according to certain aspects of the present disclosure.

FIG. 16 illustrates a method 1600 for operating a comparator. The comparator (e.g., comparator 605) includes a first transistor (e.g., first transistor 622), a second transistor (e.g., second transistor 624), a third transistor (e.g., third transistor 630), and a fourth transistor (e.g., fourth transistor 635), wherein the third transistor is coupled series with the first transistor and coupled between the first transistor and a first node (e.g., first node 632), and the fourth transistor is coupled in series with the second transistor and coupled between the second transistor and the second node (e.g., second node 637).

At block 1610, a gate of the first transistor is driven with a first signal. For example, the first signal may correspond to the first signal inp of the differential input signal or the input signal of the pseudo differential signal.

At block 1620, a gate of the second transistor is driven with a second signal. The second signal may correspond to the second input signal inn or the reference signal.

At block 1630, a first voltage at a gate of the third transistor is adjusted based on a first decision feedback signal. For example, the first voltage may correspond to the first gate voltage vg1. In certain aspects, the first voltage at the gate of the third transistor may be adjusted by the fifth transistor 642 and the first resistor 650.

At block 1640, a second voltage at a gate of the fourth transistor is adjusted based on a second decision feedback signal. For example, the second voltage may correspond to the second gate voltage vg2. In certain aspects, the second voltage at the gate of the fourth transistor may be adjusted by the sixth transistor 644 and the second resistor 655.

At block 1650, a bit decision is made based on a third voltage on the first node and a fourth voltage on the second node. For example, the third voltage may correspond to the first voltage v1, and the fourth voltage may correspond to the second voltage v2. In certain aspects, the bit decision may be made by the regeneration stage 680.

In certain aspects, the first decision feedback signal corresponds to a previous bit decision of the comparator, and the second decision feedback signal corresponds to a complement of the previous bit decision.

In certain aspects, the first decision feedback signal corresponds to a previous bit decision of another comparator that is time-interleaved with the comparator, and the second decision feedback signal corresponds to a complement of the previous bit decision. For example, the comparator may correspond to the comparator 605A and the other comparator may correspond to the comparator 605B in the example shown in FIG. 12.

In certain aspects, the comparator includes a first resistor coupled between the gate of the third transistor and a rail. The rail may correspond to the supply rail 690 or the low rail 695. In these aspects, adjusting the first voltage at the gate of the third transistor based on the first decision feedback signal may include driving a gate of a fifth transistor with the first decision feedback signal to generate a first current, and routing the first current through the first resistor. The first current may correspond to the third current discussed above.

In certain aspects, the comparator includes a second resistor coupled between the gate of the third fourth and the rail. The rail may correspond to the supply rail 690 or the low rail 695. In these aspects, adjusting the second voltage at the gate of the fourth transistor based on the second decision feedback signal may include driving a gate of a sixth transistor with the second decision feedback signal to generate a second current, and routing the second current through the second resistor. The second current may correspond to the fourth current discussed above.

In certain aspects, making the bit decision based on the third voltage on the first node and the fourth voltage on the second node may include making the bit decision based on a ramp rate of the third voltage on the first node and a ramp rate of the fourth voltage on the second node. In one example, the third voltage and the fourth voltage ramp up (e.g., from approximately Vss) at different rates. In another example, the third voltage and the fourth voltage ramp down (e.g., from approximately Vdd) at different rates.

Implementation examples are described in the following numbered clauses:

1. A comparator, comprising:
   an input stage, comprising:
   a first transistor, wherein a gate of the first transistor is coupled to a first input of the input stage;
   a second transistor, wherein a gate of the second transistor is coupled to a second input of the input stage;
   a third transistor coupled in series with the first transistor;
   a fourth transistor coupled in series with the second transistor;
   a fifth transistor, wherein a gate of the fifth transistor is configured to receive a first decision feedback signal, and a drain of the fifth transistor is coupled to a gate of the third transistor; and
   a sixth transistor, wherein a gate of the sixth transistor is configured to receive a second decision feedback signal, and a drain of the sixth transistor is coupled to a gate of the fourth transistor.
2. The comparator of clause 1, wherein:
   the first decision feedback signal corresponds to a previous bit decision of the comparator; and
   the second decision feedback signal corresponds to a complement of the previous bit decision.
3. The comparator of clause 1, wherein:
   the first decision feedback signal corresponds to a previous bit decision of another comparator that is time-interleaved with the comparator; and
   the second decision feedback signal corresponds to a complement of the previous bit decision.
4. The comparator of any one of clauses 1 to 3, wherein the input stage further comprises:
   a first resistor coupled between the gate of the third transistor and a first rail; and
   a second resistor coupled between the gate of the fourth transistor and the first rail.
5. The comparator of clause 4, wherein the input stage further comprises a current source, wherein the current source is coupled between a source of the fifth transistor and a second rail, and the current source is coupled between a source of the sixth transistor and the second rail.
6. The comparator of clause 5, wherein the second rail comprises a supply rail, and the first rail has a lower potential than the supply rail.
7. The comparator of clause 5, wherein the first rail comprises a supply rail, and the second rail has a lower potential than the supply rail.
8. The comparator of any one of clauses 1 to 7, wherein the input stage further comprises a first switching circuit, wherein the first switching circuit is configured to:
   receive a clock signal;
   decouple a source of the first transistor and a source of the second transistor from a first rail during a first portion of a cycle of the clock signal; and
   couple the source of the first transistor and the source of the second transistor to the first rail during a second portion of the cycle of the clock signal.
9. The comparator of clause 8, wherein the third transistor is coupled between the first transistor and a first node, the fourth transistor is coupled between the second transistor and a second node, and the input stage further comprises a second switching circuit, wherein the second switching circuit is configured to:
   receive the clock signal;
   couple the first node and the second node to a second rail during the first portion of the cycle of the clock signal; and
   decouple the first node and the second node from the second rail during the second portion of the cycle of the clock signal.
10. The comparator of clause 9, wherein the first rail comprises a supply rail, and the second rail has a lower potential than the supply rail.
11. The comparator of clause 9, wherein the second rail comprises a supply rail, and the first rail has a lower potential than the supply rail.
12. The comparator of any one of clauses 9 to 11, wherein the second switching circuit comprises:
   a first switch coupled between the first node and the second rail; and
   a second switch coupled between the second node and the second rail.
13. The comparator of any one of clauses 9 to 12, further comprising a regeneration stage, wherein the regeneration stage comprises:
   a first inverter;
   a second inverter cross coupled with the first inverter;
   a first drive transistor coupled to the first inverter, wherein a gate of the first drive transistor is coupled to the first node; and
   a second drive transistor coupled to the second inverter, wherein a gate of the second drive transistor is coupled to the second node.
14. The comparator of any one of clauses 1 to 13, wherein the comparator is configured to receive a differential input signal including a first input signal and a second input signal, the first input signal is input to the first input of the input stage, and the second input signal is input to the second input of the input stage.
15. The comparator of any one of clauses 1 to 13, wherein the first input of the input stage is configured to receive an input signal, and the comparator further comprises:
   a digital-to-analog converter (DAC), wherein the DAC has an output coupled to the second input of the comparator, and the DAC is configured to generate a reference signal, and output the reference signal at the output of the DAC.
16. The comparator of any one of clauses 1 to 15, wherein the input stage further comprises:
   a seventh transistor, wherein a gate of the seventh transistor is configured to receive a third decision feedback signal, and a drain of the seventh transistor is coupled to the gate of the third transistor; and
   an eighth transistor, wherein a gate of the eighth transistor is configured to receive a fourth decision feedback signal, and a drain of the eighth transistor is coupled to the gate of the fourth transistor.
17. The comparator of clause 16, wherein:
   the first decision feedback signal corresponds to a first previous bit decision of the comparator;
   the second decision feedback signal corresponds to a complement of the first previous bit decision;
   the third decision feedback signal corresponds to a second previous bit decision of the comparator; and
   the fourth decision feedback signal corresponds to a complement of the second previous bit decision.
18. The comparator of clause 16, wherein:
   the first decision feedback signal corresponds to a previous bit decision of another comparator that is time-interleaved with the comparator;
   the second decision feedback signal corresponds to a complement of the previous bit decision of the other comparator;

the third decision feedback signal corresponds to a previous bit decision of the comparator; and the fourth decision feedback signal corresponds to a complement of the previous bit decision of the comparator.

19. The comparator of any one of clauses 1 to 18, wherein the third transistor is coupled between the first transistor and a first node, the fourth transistor is coupled between the second transistor and a second node, and the comparator further comprises:

a regeneration stage having a first input, a second input, a first output, and a second output, wherein the first input of the regeneration stage is coupled to the first node, and the second input of the regeneration stage is coupled to the second node.

20. The comparator of clause 19, wherein the regeneration stage is configured to:

determine a bit value based on a first voltage on the first node and a second voltage on the second node;

output the bit value at the first output of the regeneration stage; and output a complement of the bit value at the second output of the regeneration stage.

21. The comparator of clause 20, wherein the regeneration stage is configured to determine the bit value based on a ramp rate of the first voltage and a ramp rate of the second voltage.

22. The comparator of any one of clauses 19 to 21, wherein the input stage further comprises a switching circuit, wherein the switching circuit is configured to:

receive a clock signal;

couple the first node and the second node to a rail during a first portion of the cycle of the clock signal; and decouple the first node and the second node from the rail during a second portion of the cycle of the clock signal.

23. A method of operating a comparator, the comparator including a first transistor, a second transistor, a third transistor, and a fourth transistor, wherein the third transistor is coupled series with the first transistor and coupled between the first transistor and a first node, and the fourth transistor is coupled in series with the second transistor and coupled between the second transistor and a second node, the method comprising:

driving a gate of the first transistor with a first signal;

driving a gate of the second transistor with a second signal;

adjusting a first voltage at a gate of the third transistor based on a first decision feedback signal;

adjusting a second voltage at a gate of the fourth transistor based on a second decision feedback signal; and making a bit decision based on a third voltage on the first node and a fourth voltage on the second node.

24. The method of clause 23, wherein:

the first decision feedback signal corresponds to a previous bit decision of the comparator; and the second decision feedback signal corresponds to a complement of the previous bit decision.

25. The method of clause 23, wherein:

the first decision feedback signal corresponds to a previous bit decision of another comparator that is time-interleaved with the comparator; and the second decision feedback signal corresponds to a complement of the previous bit decision.

26. The method of any one of clauses 23 to 25, wherein the comparator comprises a first resistor coupled between the gate of the third transistor and a rail, wherein adjusting the first voltage at the gate of the third transistor based on the first decision feedback signal comprises:

driving a gate of a fifth transistor with the first decision feedback signal to generate a first current; and routing the first current through the first resistor.

27. The method of clause 26, wherein the comparator comprises a second resistor coupled between the gate of the fourth transistor and the rail, wherein adjusting the second voltage at the gate of the fourth transistor based on the second decision feedback signal comprises:

driving a gate of a sixth transistor with the second decision feedback signal to generate a second current; and routing the second current through the second resistor.

28. The method of any one of clauses 23 to 27, wherein the first signal comprises a first input signal of a differential input signal, and the second signal comprises a second input signal of the differential input signal.

29. The method of any one of clauses 23 to 27, wherein the first signal comprises an input signal, and the second signal comprises a reference signal.

30. The method of any one of clauses 23 to 29, wherein making the bit decision based on the third voltage on the first node and the fourth voltage on the second node comprises:

making the bit decision based on a ramp rate of the third voltage on the first node and a ramp rate of the fourth voltage on the second node.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

As used herein, a first inverter and a second inverter are "cross coupled" when the input of the first inverter is coupled to the output of the second inverter and the output of the second inverter is coupled to the input of the first inverter. As used herein, two comparators are "time-interleaved" when the comparators alternate between making bit decisions. As used herein, "previous bit decision" is a bit decision previously made by a comparator.

It is to be appreciated that an n-type field effect transistor may also be referred to as an n-channel field effect transistor and a p-type field effect transistor may also be referred to as a p-channel field effect transistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A comparator, comprising:
an input stage, comprising:
a first transistor, wherein a gate of the first transistor is coupled to a first input of the input stage;
a second transistor, wherein a gate of the second transistor is coupled to a second input of the input stage;
a third transistor coupled in series with the first transistor;
a fourth transistor coupled in series with the second transistor;
a fifth transistor, wherein a gate of the fifth transistor is configured to receive a first decision feedback signal, and a drain of the fifth transistor is coupled to a gate of the third transistor;
a sixth transistor, wherein a gate of the sixth transistor is configured to receive a second decision feedback signal, and a drain of the sixth transistor is coupled to a gate of the fourth transistor;
a first resistor coupled between the gate of the third transistor and a first rail; and
a second resistor coupled between the gate of the fourth transistor and the first rail.

2. The comparator of claim 1, wherein:
the first decision feedback signal corresponds to a previous bit decision of the comparator; and
the second decision feedback signal corresponds to a complement of the previous bit decision.

3. The comparator of claim 1, wherein:
the first decision feedback signal corresponds to a previous bit decision of another comparator that is time-interleaved with the comparator; and
the second decision feedback signal corresponds to a complement of the previous bit decision.

4. The comparator of claim 1, wherein the input stage further comprises a current source, wherein the current source is coupled between a source of the fifth transistor and a second rail, and the current source is coupled between a source of the sixth transistor and the second rail.

5. The comparator of claim 4, wherein the second rail comprises a supply rail, and the first rail has a lower potential than the supply rail.

6. The comparator of claim 1, wherein the input stage further comprises a first switching circuit, wherein the first switching circuit is configured to:
receive a clock signal;
decouple a source of the first transistor and a source of the second transistor from a first rail during a first portion of a cycle of the clock signal; and
couple the source of the first transistor and the source of the second transistor to the first rail during a second portion of the cycle of the clock signal.

7. The comparator of claim 6, wherein the third transistor is coupled between the first transistor and a first node, the fourth transistor is coupled between the second transistor and a second node, and the input stage further comprises a second switching circuit, wherein the second switching circuit is configured to:
receive the clock signal;
couple the first node and the second node to a second rail during the first portion of the cycle of the clock signal; and
decouple the first node and the second node from the second rail during the second portion of the cycle of the clock signal.

8. The comparator of claim 7, wherein the first rail comprises a supply rail, and the second rail has a lower potential than the supply rail.

9. The comparator of claim 7, wherein the second switching circuit comprises:
a first switch coupled between the first node and the second rail; and
a second switch coupled between the second node and the second rail.

10. The comparator of claim 7, further comprising a regeneration stage, wherein the regeneration stage comprises:
a first inverter;
a second inverter cross coupled with the first inverter;
a first drive transistor coupled to the first inverter, wherein a gate of the first drive transistor is coupled to the first node; and
a second drive transistor coupled to the second inverter, wherein a gate of the second drive transistor is coupled to the second node.

11. The comparator of claim 1, wherein the comparator is configured to receive a differential input signal including a first input signal and a second input signal, the first input signal is input to the first input of the input stage, and the second input signal is input to the second input of the input stage.

12. The comparator of claim 1, wherein the first input of the input stage is configured to receive an input signal, and the comparator further comprises:
a digital-to-analog converter (DAC), wherein the DAC has an output coupled to the second input of the comparator, and the DAC is configured to generate a reference signal, and output the reference signal at the output of the DAC.

13. The comparator of claim 1, wherein the input stage further comprises:
a seventh transistor, wherein a gate of the seventh transistor is configured to receive a third decision feedback signal, and a drain of the seventh transistor is coupled to the gate of the third transistor; and
an eighth transistor, wherein a gate of the eighth transistor is configured to receive a fourth decision feedback signal, and a drain of the eighth transistor is coupled to the gate of the fourth transistor.

14. The comparator of claim 13, wherein:
the first decision feedback signal corresponds to a first previous bit decision of the comparator;
the second decision feedback signal corresponds to a complement of the first previous bit decision;
the third decision feedback signal corresponds to a second previous bit decision of the comparator; and
the fourth decision feedback signal corresponds to a complement of the second previous bit decision.

15. The comparator of claim 13, wherein:
the first decision feedback signal corresponds to a previous bit decision of another comparator that is time-interleaved with the comparator;
the second decision feedback signal corresponds to a complement of the previous bit decision of the other comparator;
the third decision feedback signal corresponds to a previous bit decision of the comparator; and
the fourth decision feedback signal corresponds to a complement of the previous bit decision of the comparator.

16. The comparator of claim 1, wherein the third transistor is coupled between the first transistor and a first node, the fourth transistor is coupled between the second transistor and a second node, and the comparator further comprises:
a regeneration stage having a first input, a second input, a first output, and a second output, wherein the first input of the regeneration stage is coupled to the first node, and the second input of the regeneration stage is coupled to the second node.

17. The comparator of claim 16, wherein the regeneration stage is configured to:
determine a bit value based on a first voltage on the first node and a second voltage on the second node;
output the bit value at the first output of the regeneration stage; and
output a complement of the bit value at the second output of the regeneration stage.

18. The comparator of claim 17, wherein the regeneration stage is configured to determine the bit value based on a ramp rate of the first voltage and a ramp rate of the second voltage.

19. The comparator of claim 16, wherein the input stage further comprises a switching circuit, wherein the switching circuit is configured to:
receive a clock signal;
couple the first node and the second node to a rail during a first portion of a cycle of the clock signal; and
decouple the first node and the second node from the rail during a second portion of the cycle of the clock signal.

20. A method of operating a comparator, the comparator including a first transistor, a second transistor, a third transistor, a fourth transistor, a fifth transistor, and a first resistor, wherein the third transistor is coupled in series with the first transistor and coupled between the first transistor and a first node, the fourth transistor is coupled in series with the second transistor and coupled between the second transistor and a second node, and the first resistor is coupled between a gate of the third transistor and a rail, the method comprising:
driving a gate of the first transistor with a first signal;
driving a gate of the second transistor with a second signal;
adjusting a first voltage at the gate of the third transistor based on a first decision feedback signal, comprising
driving a gate of the fifth transistor with the first decision feedback signal to generate a first current, and
routing the first current through the first resistor;
adjusting a second voltage at a gate of the fourth transistor based on a second decision feedback signal; and
making a bit decision based on a third voltage on the first node and a fourth voltage on the second node.

21. The method of claim 20, wherein:
the first decision feedback signal corresponds to a previous bit decision of the comparator; and
the second decision feedback signal corresponds to a complement of the previous bit decision.

22. The method of claim 20, wherein:
the first decision feedback signal corresponds to a previous bit decision of another comparator that is time-interleaved with the comparator; and
the second decision feedback signal corresponds to a complement of the previous bit decision.

23. The method of claim 20, wherein the comparator further includes a second resistor coupled between the gate of the fourth transistor and the rail, and a sixth transistor, wherein adjusting the second voltage at the gate of the fourth transistor based on the second decision feedback signal comprises:
driving a gate of the sixth transistor with the second decision feedback signal to generate a second current; and
routing the second current through the second resistor.

24. The method of claim 20, wherein the first signal comprises a first input signal of a differential input signal, and the second signal comprises a second input signal of the differential input signal.

25. The method of claim 20, wherein the first signal comprises an input signal, and the second signal comprises a reference signal.

26. The method of claim 20, wherein making the bit decision based on the third voltage on the first node and the fourth voltage on the second node comprises:
making the bit decision based on a ramp rate of the third voltage on the first node and a ramp rate of the fourth voltage on the second node.

* * * * *